(12) United States Patent
Boyko et al.

(10) Patent No.: US 6,214,525 B1
(45) Date of Patent: Apr. 10, 2001

(54) PRINTED CIRCUIT BOARD WITH CIRCUITIZED CAVITY AND METHODS OF PRODUCING SAME

(75) Inventors: Christina Marie Boyko; Donald Seton Farquhar, both of Endicott; Robert Maynard Japp, Vestal; Michael Joseph Klodowski, Endicott, all of NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/379,774

(22) Filed: Aug. 24, 1999

Related U.S. Application Data

(63) Continuation of application No. 08/885,766, filed on Jun. 26, 1997, now abandoned, which is a continuation-in-part of application No. 08/709,373, filed on Sep. 6, 1996, now Pat. No. 5,784,782.

(51) Int. Cl.[7] .................................................. G03F 7/00
(52) U.S. Cl. ..................... 430/313; 430/318; 430/945; 216/18; 427/97
(58) Field of Search ................... 430/313, 318, 430/945; 216/18; 427/97

(56) References Cited

U.S. PATENT DOCUMENTS

| | | |
|---|---|---|
| 4,640,010 | 2/1987 | Brown . |
| 4,729,061 | 3/1988 | Brown . |
| 4,985,601 | 1/1990 | Hagner . |
| 5,037,722 | 8/1991 | Watanuki . |
| 5,055,637 | 10/1991 | Hagner . |
| 5,118,300 | 6/1992 | Zarreii . |
| 5,168,624 | 12/1992 | Shirai . |
| 5,178,976 | 1/1993 | Rose et al. . |
| 5,557,844 | 9/1996 | Bhatt et al. . |

FOREIGN PATENT DOCUMENTS

| | | |
|---|---|---|
| 0561486A1 | 1/1993 | (EP) . |
| 4-348591 | 12/1992 | (JP) . |

OTHER PUBLICATIONS

Semiconductor Lithography Principles, Practices, and Materials/Microdevices Physics and Fabrication Technologies/Wayne M. Moreau/1988 Plenum Press, NY.

*Primary Examiner*—Kathleen Duda
(74) *Attorney, Agent, or Firm*—Schmeiser, Olsen & Watts; Arthur J. Samodovitz

(57) ABSTRACT

The invention relates to subtractive and additive processes for creating a circuitized cavity in a printed circuit board. Additionally, the invention includes a circuitized cavity and a printed circuit board with a circuitized cavity. The circuitized cavity provides for a variety of advantages over wire bonds.

38 Claims, 25 Drawing Sheets

PRINTED CIRCUIT BOARD WITH CIRCUITIZED CAVITY AND METHODS OF PRODUCING SAME

CONTINUING DATA

This application is a continuation of application Ser. No. 08/885,766 filed on Jun. 26, 1997, now abandoned, which is a continuation-in-part of application Ser. No. 08/709,373 filed on Sep. 6, 1996 and issued on Jul. 28, 1998 as U.S. Pat. No. 5,784,782.

BACKGROUND OF THE INVENTION

1. Technical Field

The invention relates generally to printed circuit boards and deals more particularly with a method for fabricating printed circuit boards having cavities. Furthermore, the invention relates more particularly to circuitized cavities in printed circuit boards, the printed circuit boards including the circuitized cavities and methods of producing the circuitized cavities.

2. Related Art

Printed circuit boards (PCBs) are well known and comprise one or more layers of dielectric material with metallizations on one or both surfaces of each layer. The dielectric layers may be made from glass-reinforced polyimide, Teflon (a trademark of E.I. duPont de Nemours) or epoxy. The metallizations comprise conductors, pads, surface lands, ground planes and power planes. Layers of different dielectric materials can be laminated together into the same board.

Some boards require cavities in one or more layers of the PCB. The cavity may be entirely plated and grounded and used to house a power amplifier to reduce stray emissions. The leads of the chip may pass through the plating at the bottom of the cavity and pass through the lower layers for attachment at the opposite face of the PCB. Alternately, the cavity can house a wire-bond chip oriented such that the connecting pads are face up.

It was known to fabricate a PCB with a cavity as follows. A window is a cutout in an epoxy core layer and a matching window is a cutout in an epoxy-glass sticker sheet. The sticker sheet may comprise "Pre-Preg" and is formed as follows. A fiberglass cloth, woven Kevlar™, or other woven or non-woven glass cloth is dipped into a solution comprising epoxy and a solvent/thinner. Then the cloth is pressed through rollers to squeeze out excess epoxy and thinner. Next, the cloth is partially dried to remove the solvent and partially cure the epoxy. The degree to which the epoxy remains uncured determines the degree to which the pre-preg will flow when subsequently laminated.

The epoxy core layer and epoxy-glass sticker sheet are laid on a solid Teflon-glass core layer with the sticker sheet in the middle such that the windows in the epoxy core layer and epoxy-glass sticker sheet are registered with each other. Then, the laminate is heated to fully cure the epoxy-glass sticker sheet and thereby bond the epoxy core layer to the Teflon-glass core.

However, a problem has resulted in that a "high-flow" type of epoxy-glass sticker sheet (i.e. relatively uncured before lamination) seeps into the cavity in the epoxy core layer during lamination thereby covering the metallization on the Teflon-glass core layer. A "no-flow" or "low flow" type of epoxy-glass sticker sheet will reduce such seepage but is much more expensive than the "high-flow" type and tends to trap air during the heating/lamination process. Also, the windows in the low-flow sticker sheet must be closely tailored to the windows in the epoxy core layer before lamination, for example a 0.02" recess back from each side of the window to permit the epoxy-glass sticker material to flow to the edges of the window in the epoxy core layer. Even with this precision, the low-flow epoxy-glass sticker material does not form a good seal at the base perimeter of the cavity due in part to the substantially pre-cured nature of the epoxy. Ideally, there would be a continuous fillet of the epoxy-glass sticker material at the base perimeter of the cavity to form a good seal between the epoxy core layer and the Teflon-glass core layer and not cover the bottom of the cavity.

U.S. Pat. No. 4,636,275 discloses an elastic bladder which is pressed by a fluid into a cavity in epoxy glass layers to seal the layers while adhesive between the layers is cured.

U.S. Pat. Nos. 4,643,935 and 4,680,075 disclose a thermo-plastic plug which is initially shaped by pressing a thermo-plastic blank into a dummy cavity. Then, the plug is inserted into a similarly shaped cavity in a real multi-layer board, and the multi-layer board is laminated. The plug deters seepage.

While thermoplastic materials are generally effective to plug cavities, the thermoplastic materials become softer and softer with rising temperature, i.e. they melt. Some lamination processes require such high temperature that the thermoplastic material may be too soft to effectively dam a high flow pre-preg sticker sheet.

A general object of the present invention is to fabricate a printed circuit board laminate with a cavity in one or more layers in such a way that is cost effective, forms a good seal at the base perimeter of the cavity, securely bonds the layers together and does not permit adhesive from between the layers to coat the bottom of the cavity.

Furthermore, with regard to the usage of cavities for mounting of electronic components, heretofore, usage of these cavities and the electrical connections associated therewith have incorporated manufacturing techniques and designs which create a number of drawbacks. For instance, the conventional provision of encapsulant over wiring connections (wire bonds) that span from a surface of the PCB, and more specifically a laminate chip carrier, to an electronic component seated in the cavity inhibits cooling of the electronic component. This encapsulation also adds undesirable height and mass to the chip carrier and practically prohibits access to the wire bonds when subsequent rework is necessary. Since the wire bonds are attached at the top of the electronic component, they are also subject to potential damage during manufacturing. Furthermore, since a single electronic component requires a multitude of electrical connections, crowding of the connections is common.

In U.S. Pat. Nos. 4,985,601 and 5,055,637 a cavity is shown with a layer of electrically conductive material laid therein.

In U.S. Pat. Nos. 4,640,010 and 4,729,061 cavities 18 are provided with copper covered sidewalls to prevent off-gassing from the exposed laminate on the cavity sidewall when filled with encapsulant.

Accordingly, another general feature of the present invention is to provide a printed circuit board with a circuitized cavity such that electrical connections to an electrical component within the cavity may be made within the cavity.

SUMMARY OF THE INVENTION

The invention resides in a method for fabricating a printed circuit board with a cavity. The method comprises the step of laying a sticker sheet on a first, metallized dielectric layer and laying a second, metallized dielectric layer on the sticker sheet. The second metallized dielectric layer and the sticker sheet each have a window which is registered with the other window forming a cavity. Next, a flexible release layer is laid above the second metallized dielectric layer and a thermosetting visco-plastic material is laid on the release layer over the cavity. Next, the first and second metallized dielectric layers, sticker sheet, release layer and visco-plastic material are laminated by heat and pressure to cure the sticker sheet and thereby bind the first and second metallized dielectric sheets to each other. During the lamination step, the sticker sheet flows to the perimeter of the cavity. However, the pressure forces the visco-plastic material tightly into the cavity to seal a bottom perimeter of the cavity such that the sticker sheet does not seep onto much of a floor of the cavity. Instead, the sticker sheet forms a fillet at the bottom perimeter of the cavity.

If desired, the cavity can be plated and grounded, and an electronic component such as an amplifier can be mounted in the cavity such that the plating forms an electromagnetic shield for the amplifier. The invention also resides in the final product, i.e. a plated cavity.

Furthermore, the invention includes a first subtractive processing method of circuitizing a cavity, and in particular a cavity sidewall, in a PCB. The method comprises the steps of providing a cavity in the printed circuit board, applying a conductive material to at least the cavity, applying a photo resist to at least the cavity, exposing the photo resist to delineate the position of a contiguous circuit feature across at least a part of the cavity, developing the photo resist, and removing the excess conductive material and photo resist to create circuit features across at least a part of the cavity.

The invention also includes a second pattern or additive processing method of circuitizing a cavity in a printed circuit board. The second method including the steps of: providing a cavity in the printed circuit board, applying a seeding material to at least the cavity, applying a photo resist to at least the cavity, exposing the photo resist to determine the positioning of circuit features across at least the cavity, developing the photo resist to form channels in the photo resist where the photo resist was not exposed, applying a conductive material to at least the cavity to form circuit features in the channels, and removing the photo resist and seeding material to create contiguous circuit features in at least the cavity.

The invention also includes a cavity in a printed circuit board having circuit features running along a sidewall thereof and a printed circuit board having a cavity located in the surface, and circuit features extending along at least the cavity.

Circuitized cavities created by the above methods and used in the above PCB offer a number of advantages over non-circuitized cavities. First, circuit features, e.g., circuit lines, formed in the cavity sidewall may be used as a 'replacement' for wire bond connections. Alternatively, power and signal connections can be connected to the top (e.g., conventional wire bond connections) and the bottom of the component, hence, offering additional input/output (I/O) density and/or reduced crowding of connections to the electronic component. Second, since the circuitized cavity connections are self supporting and do not require encapsulation, they are more reliable and easier to rework than conventional encapsulated wire bond chips. Third, as encapsulation is not required across the top of the electronic component, the top of the component is available for heat conduction away from the component. Fourth, completely flush ball grid array (BGA) packages can be designed. Fifth, circuitized cavity sidewalls also offer the opportunity to exit signals without a distinct and separate plated through hole (PTH) because internal circuit lines can terminate at the cavity sidewall and be electrically connected by circuit features. These plated connections could then travel down to the electronic component, up or down to another layer where they re-enter the PCB interior, or around the sidewalls of the cavity.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Figure 1:
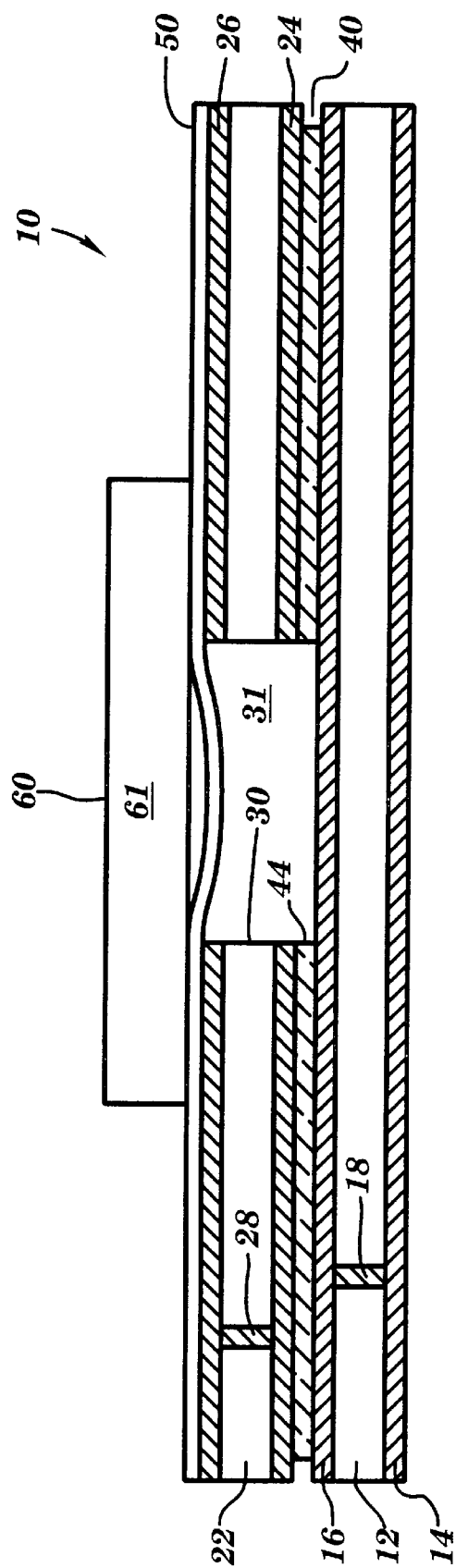
FIG. 1 illustrates components of a printed circuit board during an intermediate stage in fabrication according to the present invention.
Figure 2:
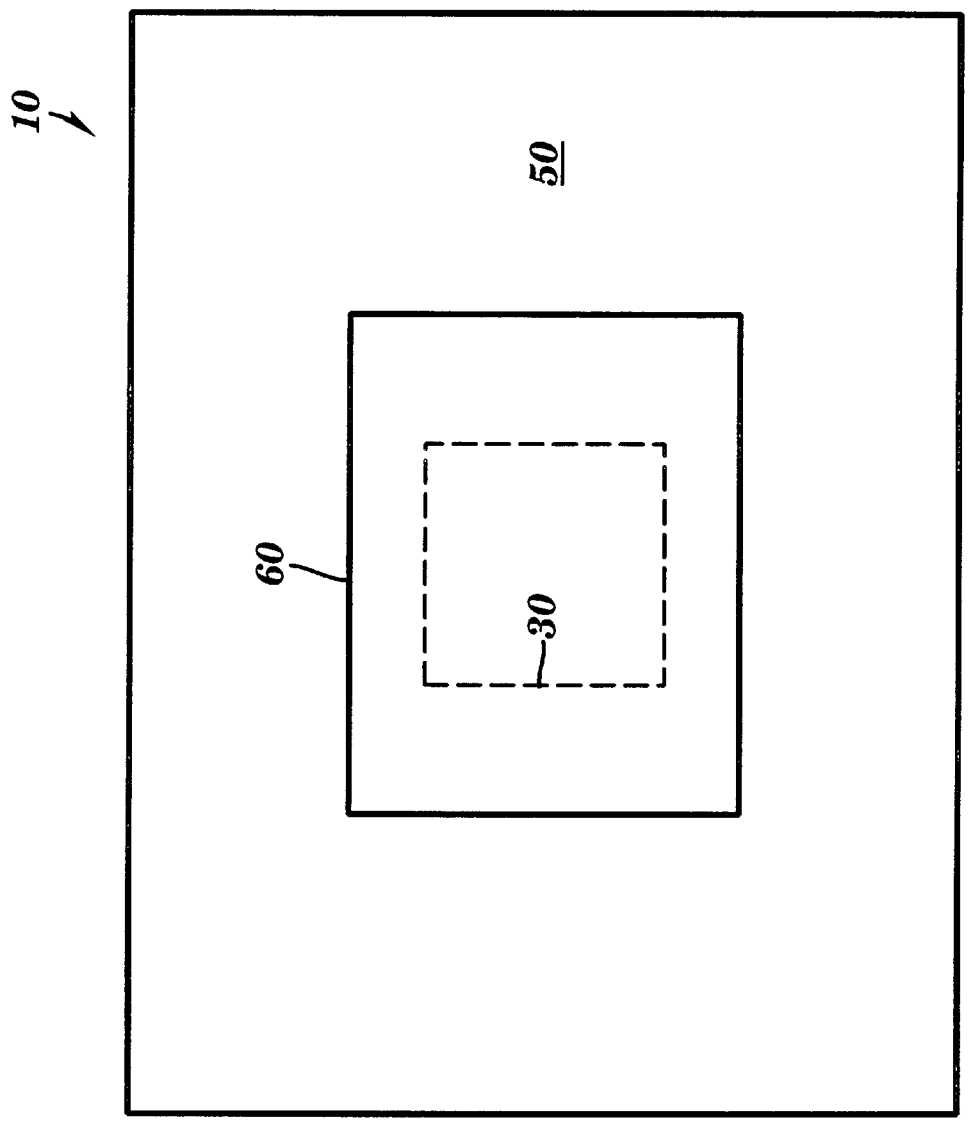
FIG. 2 is a top view of FIG. 1.

Referring now to the drawings in detail, wherein like reference numbers indicate like elements throughout, FIGS. 1–7 illustrate a method for fabricating a printed circuit board generally designated 10 according to the present invention. FIG. 1 illustrates the layers of the printed circuit board 10 before lamination. More specifically, FIG. 1 illustrates a dielectric layer 12 such as Teflon-glass core with metallizations 14 and 16 on both surfaces. By way of example, metallization 16 is a ground plane and metallization 14 comprises conductors. A metal via 18 also passes through dielectric layer 12. FIG. 1 also illustrates another dielectric layer 22 such as epoxy core with metallizations 24 and 26 on both surfaces. By way of example, metallization 24 comprises conductors and metallization 26 comprises conductors and surface lands for electronic components. A metal via 28 also passes through dielectric layer 22. As illustrated in FIGS. 1 and 2, a window 30 was cut in dielectric layer 22 to form a cavity 31. By way of example, the window was cut by routing or punching. The resultant cavity 31 can be various shapes such as rectangular as shown (or circular). The dimensions of the cavity can also vary greatly. For a cavity depth of approximately 0.5 millimeters (mm), the minimum diameter/width of the cavity would be approximately 2 mm and for a cavity depth of approximately 0.1 mm, the minimum diameter/width of the cavity would be approximately 0.4 mm.

Sticker/adhesive sheet 40 (which may actually comprise two or more separate sticker sheets as desired) such as epoxy-glass or "pre-preg" is located between metallized dielectric sheets 12 and 22. The pre-preg is "high-flow", for example, pre-cured about 20% and is approximately 0.2 mm thick. Other pre-pregs of about 15%–40% curing will also suffice. A window 44 was also cut in sticker sheet 40, and this window is registered with window 30 in dielectric layer 22, except that window 44 is cut-back between approximately 0.5 mm and approximately 2 mm from the perimeter of window 30.

A release layer 50 lies on top of metallized dielectric layer 22. By way of example, release layer 50 comprises highly stretchable and conformable tetrafluoroethylene-perfluoroalkyl vinyl ether or "PFA"™ material by E. I. du Pont De Nemours. The PFA material is a Teflon co-polymer between approximately 0.01 mm and approximately 0.05 mm thick. An alternate material is fluorinated ethylene propylene or "FEP" which is also a Teflon co-polymer.

A sheet 60 of plug material 61 is laid on top of release layer 50. The plug material is a thermosetting visco-plastic polymer. At room temperature, the material is soft and deformable, and will readily conform to fine features (about 0.02 mm), but as temperature increases, the viscosity decrease in the material is counteracted by cross-linking ("reactivity") within the material. This prevents the material from melting. Thus, at room temperature the material is pliable enough to tightly conform to the cavity 31 and seal in the sticker sheet 40 at the base of cavity 31. A shear modulus of about 100–400 kilo-Pascal (kPa) is preferred at room temperature. The shear modulus indicates the material's mechanical resistance to deformation by shearing force. When heated during the lamination of the printed circuit board, the material 61 maintains sufficient shear resistance to retain its shape and continue to prevent the epoxy of the sticker sheet from seeping into the cavity. A minimum shear modulus of about 10 kPa for material 61 is preferred during the curing process. By way of example, the material of sheet 60 is General Sealant's "GS-43 MR" material, and the sheet 60 is approximately 3 mm thick and extends beyond hole 30 by approximately 3 mm on all sides. Alternately, material 61 could be a catalyzed silicone rubber, such as General Electric Co. GE 6075 general Purpose Elastomer. The following table indicates the shear modulus of each material as a function of temperature:

| Temperature | Shear Modulus GS 43MR | Shear Modulus GE 6075 |
| --- | --- | --- |
| 20° C. | 120 kPa | 300 kPa |
| 50° C. | 80 kPa | 290 kPa |
| 100° C. | 30 kPa | 275 kPa |
| 150° C. | 10 kPa | 700 kPa |
| 200° C. | 40 kPa | 2000 kPa |

Figure 3:
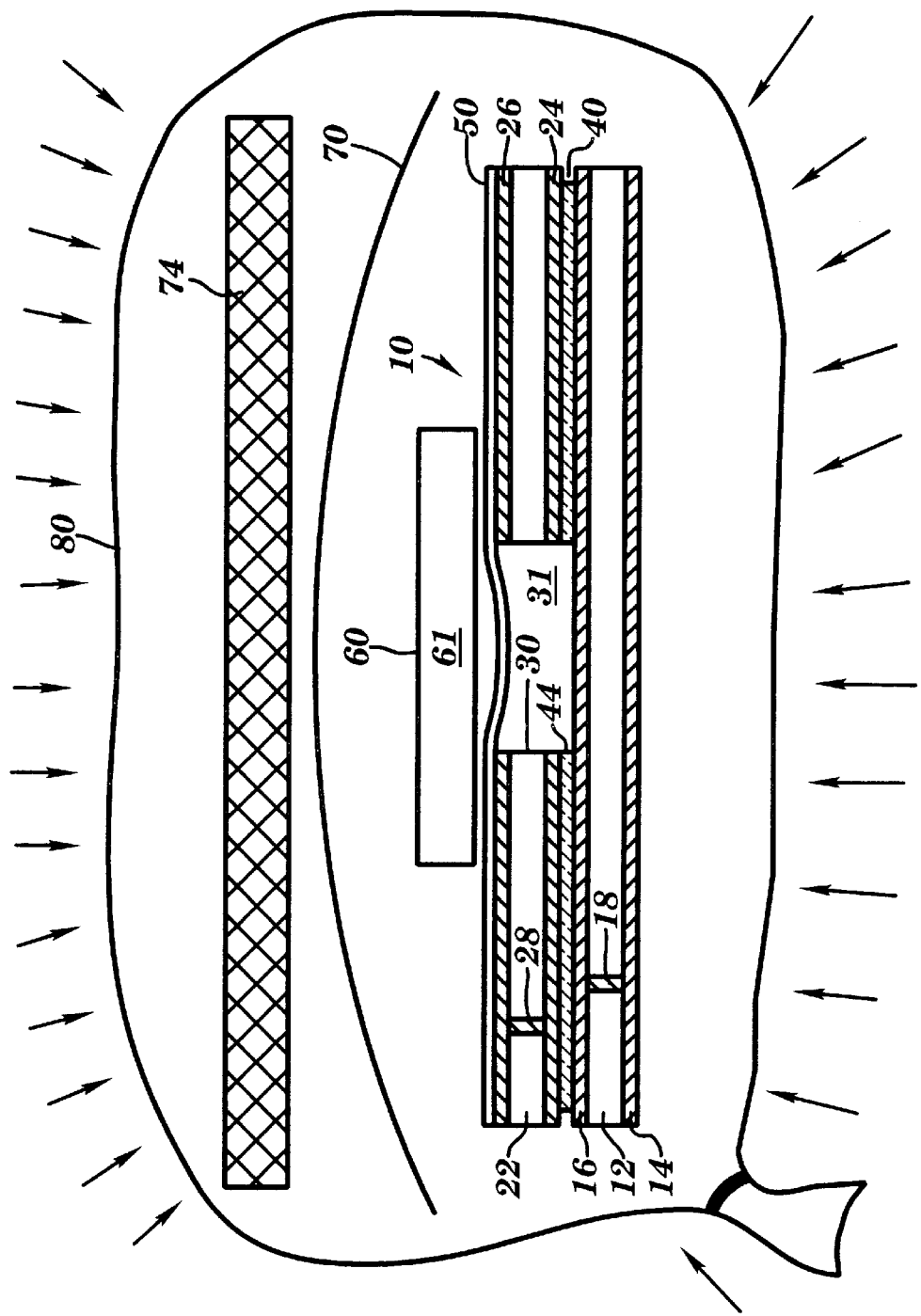
FIG. 3 illustrates the printed circuit board of FIG. 1 during a later stage in the fabrication process.

Next as illustrated in FIG. 3, the foregoing layers are prepared for lamination as follows. Another non-melting release layer 70 is laid over sheet 60. By way of example, release layer 70 comprises pure Teflon and has a thickness between approximately 0.025 mm and approximately 0.05 mm. Then, a breather layer 74, for example, Airtech Corporation's "Super Breather" woven nylon sheet about 10 mm thick is laid over release layer 70. Next the complete structure is placed in a 0.05 mm thick nylon bag 80 and the bag is evacuated and sealed. Finally, the nylon bag and contents are placed in an autoclave and subjected to heat and pressure, for example, 160° C.–210° C. and 1300 kPa–1500 kPa, respectively, for a typical epoxy resin suitable for printed circuit boards.

Figure 4:
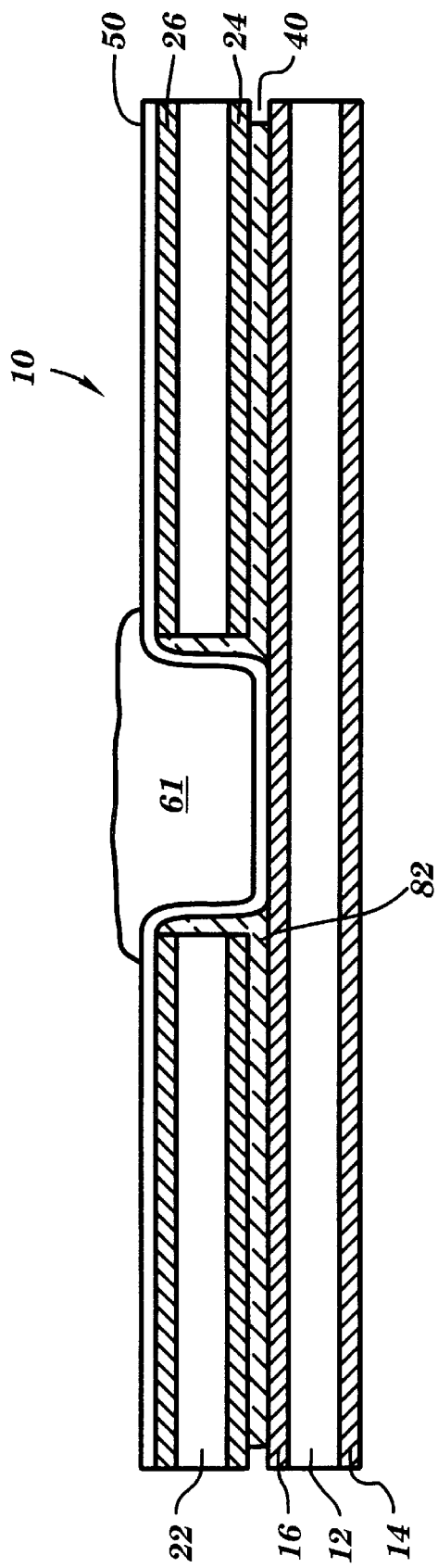
FIG. 4 illustrates the printed circuit board of FIG. 3 during a still later stage in the fabrication process.

Referring now to FIG. 4, the release layer 70, sheet 74 and bag 80 are removed. The sticker sheet 40 binds ground plane 16 to metallized dielectric layer 22. The heat and pressure cause the sticker sheet material to flow to and slightly within the base perimeter of the cavity 31, where it is dammed by the plug material 61 and release layer 50. This leaves a fillet 82 of the sticker sheet material along the bottom perimeter of the cavity 31. This fillet has a smooth and concave surface, which minimizes stress concentrations and the tendency to trap fluids or contaminants during subsequent processing. By way of example, the sticker sheet material flows between approximately 1 mm and approximately 1.5 mm within the base perimeter of the cavity 31. The distance that the sticker sheet material flows into the cavity 31 depends on the viscosity of the plug material 61, thickness of release layer 70 and flexibility of release layer 70.

Figure 5:
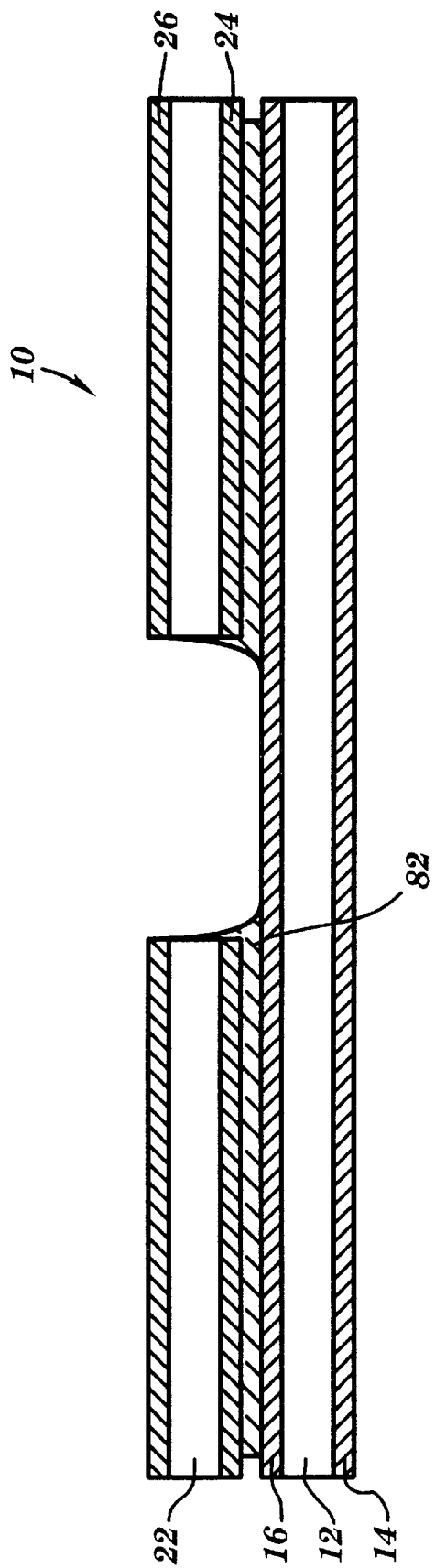
FIG. 5 illustrates the printed circuit board of FIG. 4 during a still later stage in the fabrication process, i.e. after the layers are laminated and a cavity is formed.

After the foregoing lamination process is complete, the release layer 50 and plug material 61 are removed leaving the printed circuit board 10 as illustrated in FIG. 5.

For some applications, plating of the cavity is required. Accordingly, cavity 31 is prepared for plating using hole clean (desmear) processes that are standard in the printed circuit industry. One such process would include three steps. The first step is using organic solvent such as n-methyl pyrrolidone to soften the epoxy. The second step is using either potassium or sodium permanganate to etch the epoxy surface. The third and final step is using a neutralizer, such as hydrogen peroxide/sulfuric acid, to stop the permanganate etching reaction.

Figure 6:
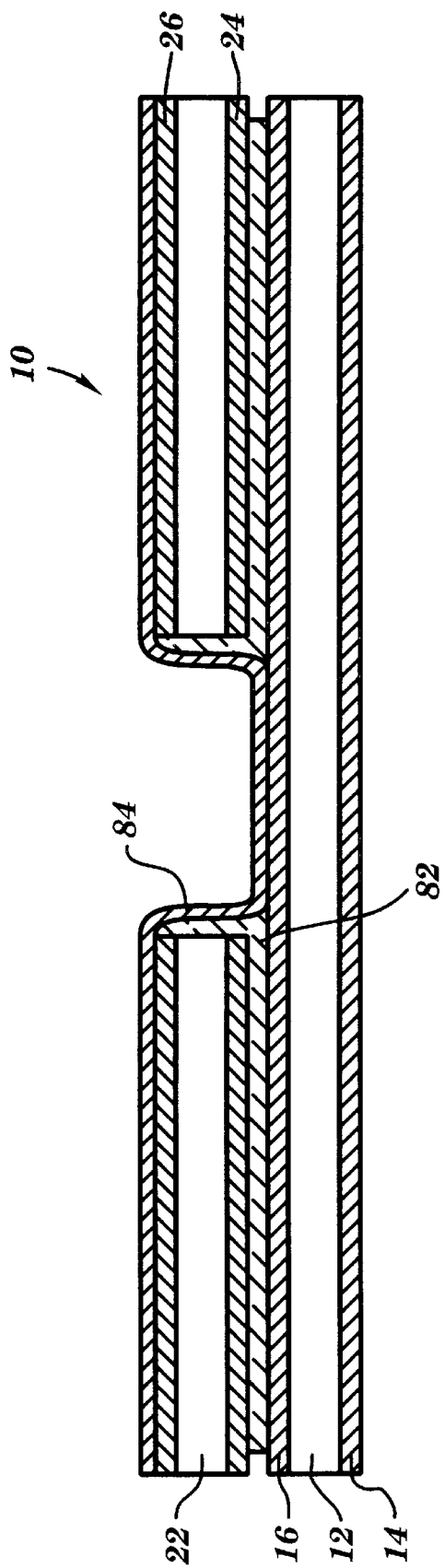
FIG. 6 illustrates the printed circuit board of FIG. 5 during a still later stage in the fabrication process, i.e. after the cavity is plated.

Next, an electroless copper plating process is used to deposit a thin layer of copper on the fillet surface. A typical electroless copper thickness is between approximately 0.6 micrometers ($\mu$m) and approximately 1.2 $\mu$m. Next, copper is electrolytically plated to yield a plate 84 as illustrated in FIG. 6. An acid copper bath is typically used for this step. Plate 84 is electrically connected to metallizations 16 and 26 and is typically grounded.

Figure 7:
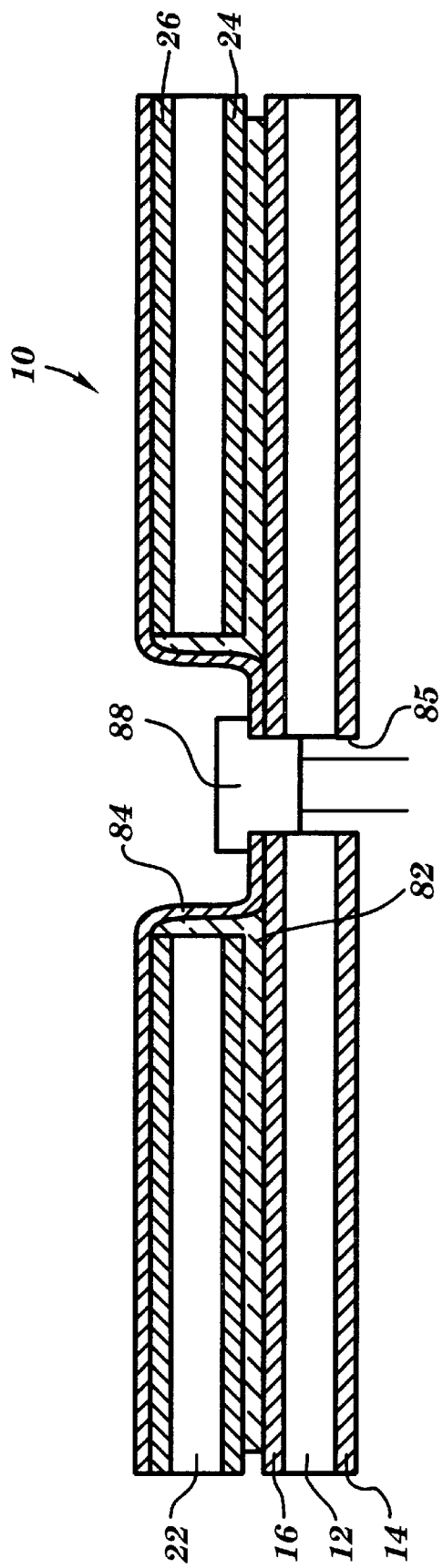
FIG. 7 illustrates the printed circuit board of FIG. 6 during a still later stage in the fabrication process, i.e. after an electronic component is mounted within the plated cavity.

FIG. 7 illustrates that a hole 85 has been subsequently drilled within the cavity 31 through plate 84 and metallized dielectric layer 12. An electronic component 88, such as a transistor, is mounted in the resultant hole 85 with its leads extending through the hole 85.

Figure 8:
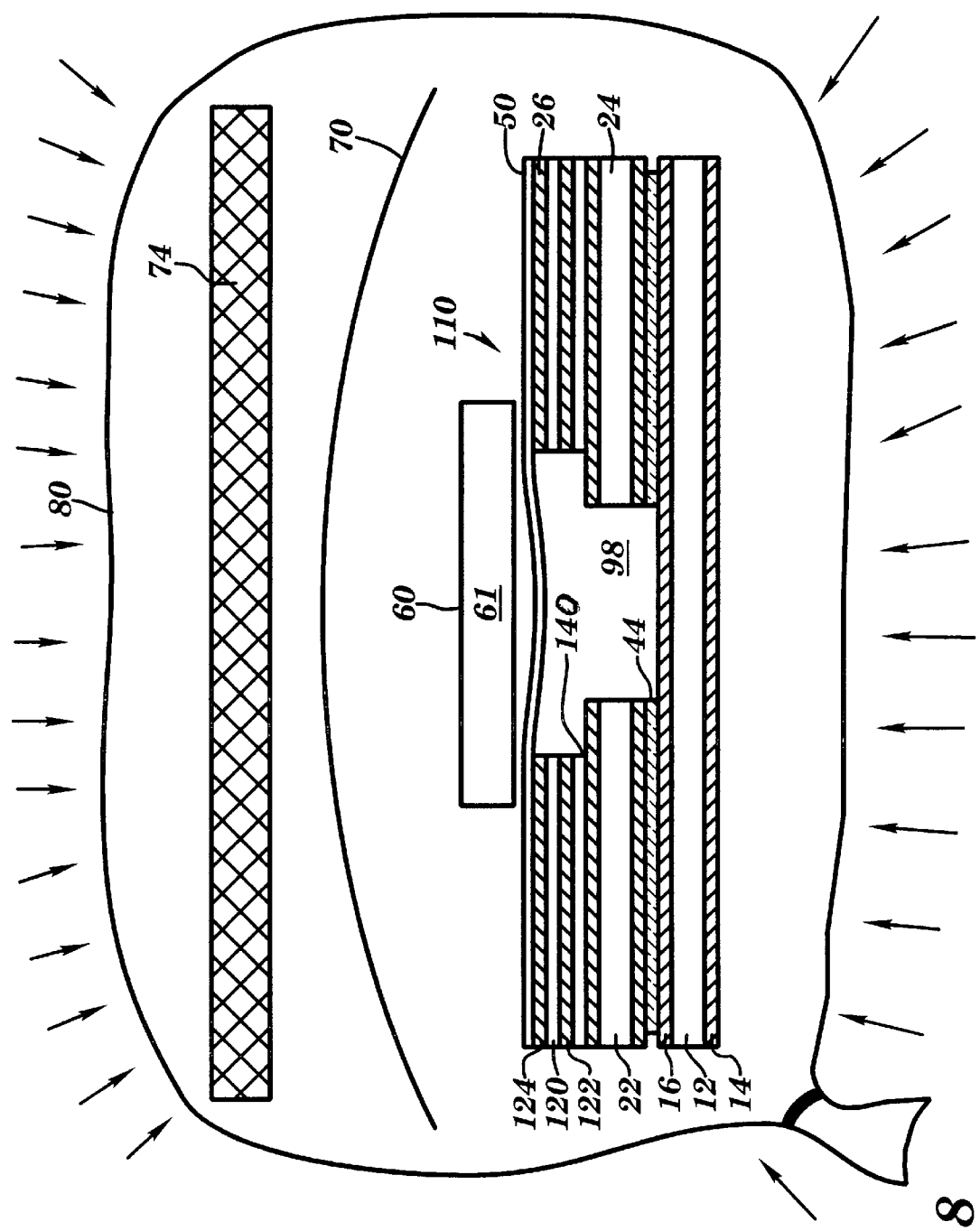
FIG. 8 illustrates components of another printed circuit board during an intermediate stage in fabrication according to another embodiment of the present invention.

FIG. 8 illustrates another embodiment of the present invention in which a stepped cavity 98 in a printed circuit board 110 is plugged with material 61. Printed circuit board 110 is identical to printed circuit board 10 except as follows. A metallized dielectric layer comprising a dielectric layer 120, metallization 122, metallization 124 and epoxy sticker sheet 140 are laid on metallization 26 before any lamination has occurred. Dielectric layer 120, metallization 122, metallization 124 and epoxy sticker sheet 140 are identical to dielectric layer 12, metallization 14, metallization 16 and epoxy sticker sheet 40, respectively except that the former have a larger window. Thus, the layers form the basis for stepped cavity 98. Then, release layer 50 and sheet 60 of material 61 are laid over the cavity 98.

Figure 9:
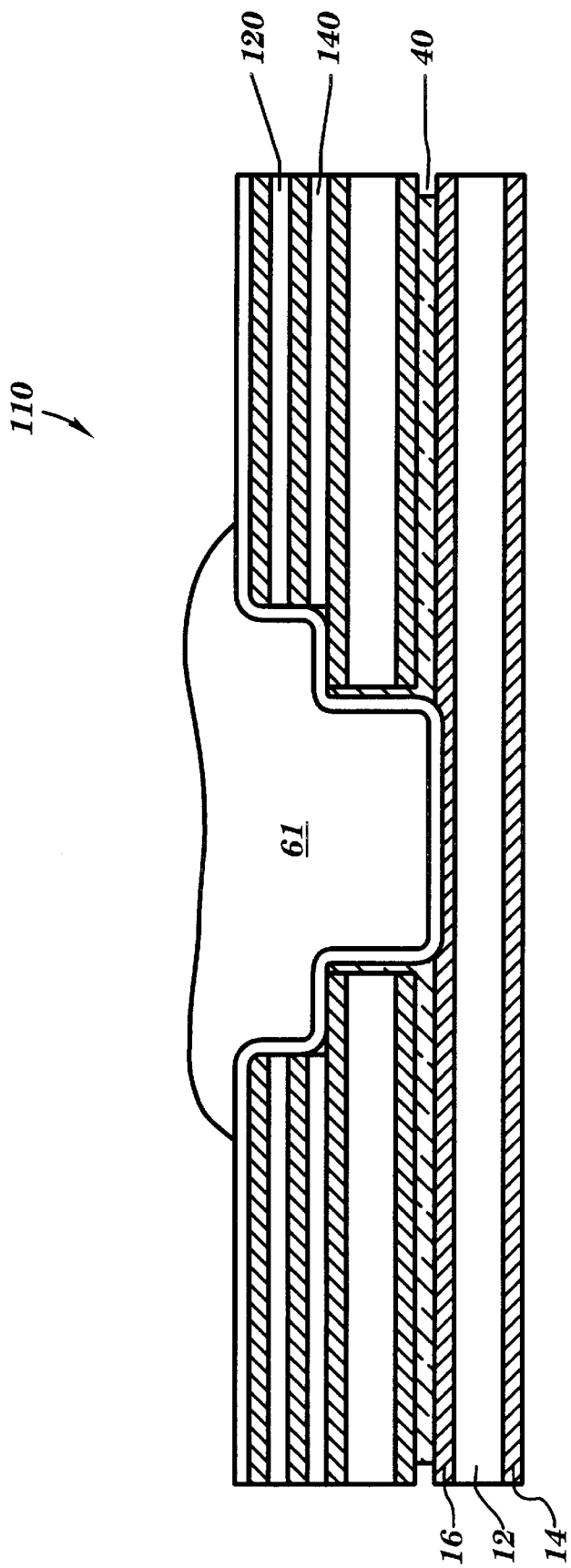
FIG. 9 illustrates the printed circuit board of FIG. 8 during a still later stage in the fabrication process.

Printed circuit board 110 is then subject to the same autoclaving process (including release layer 70, breather layer 74 and bag 80) as was printed circuit board 10 and the result is illustrated in FIG. 9. The material 61 has effectively plugged cavity 98 such that sticker material layers 40 and 140 have been dammed so that they form a fillet around the perimeter of the cavity 98.

Figure 10:
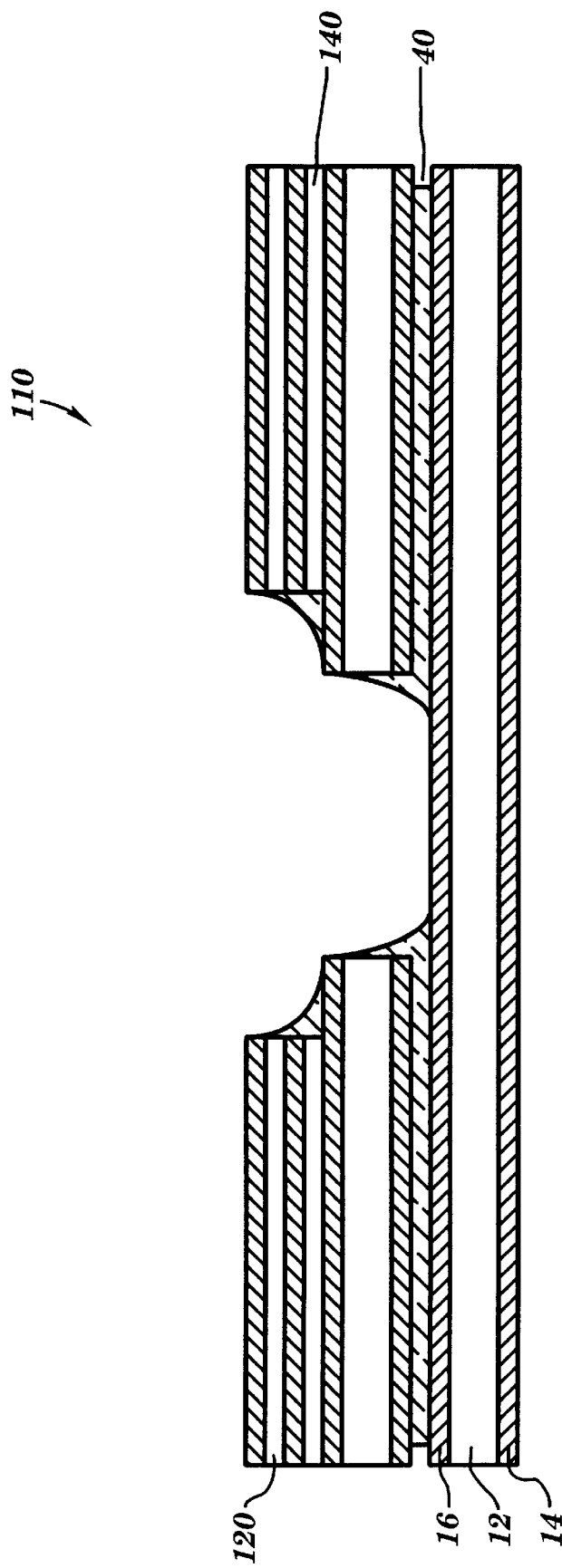
FIG. 10 illustrates the printed circuit board of FIG. 9 during a still later stage in the fabrication process, i.e. after the layers are laminated and a cavity is formed.

Next, the release layer 70, breather layer 74 and bag 80 are removed leaving printed circuit board 110 as illustrated in FIG. 10. Although not shown, if desired, cavity 98 could also be plated in the same manner that cavity 31 was plated.

Based on the foregoing, processes for fabricating printed circuit boards have been disclosed. However, numerous modifications and substitutions can be made without deviating from the scope of the present invention. For example, the foregoing fabrication process could also be used for cavities with multiple or tiered steps. Also, a flat bed press can be used instead of the autoclave to compress the structure of FIG. 3. However, when using the flat bed press, layer 70 is omitted to allow material 61 to bleed into the breather material 74. Also, when using the flat bed press, bag 80 is omitted and a pressure of approximately 2000 kPa is applied at a temperature of approximately 175° C. Therefore, the invention has been disclosed by way of illustration and not limitation and reference should be made to the following claims to determine the scope of the present invention.

Referring now to FIGS. 11–21, processes for creating a PCB 210, e.g., a laminate chip carrier, with a circuitized cavity and the PCB so created are illustrated. It is important to note that while the cavity 231 as shown includes fillets 282, as created by the above described process, the present invention of a PCB with circuitized cavity need not include fillets 282. Similarly, the processes of creating the circuitized cavity in the PCB need not include a step to create or otherwise provide the fillets.

With regard to the circuitization of the cavities, however, cavities with properly filleted sidewalls are more easily circuitized than non-filleted cavities having sidewalls at right angles (i.e., square) to the bottom of the cavity. However, for simplicity, description of the processes is provided hereafter without regard to whether the cavity has filleted or non-filleted sidewalls except where a distinction is otherwise appropriate.

Figure 11:
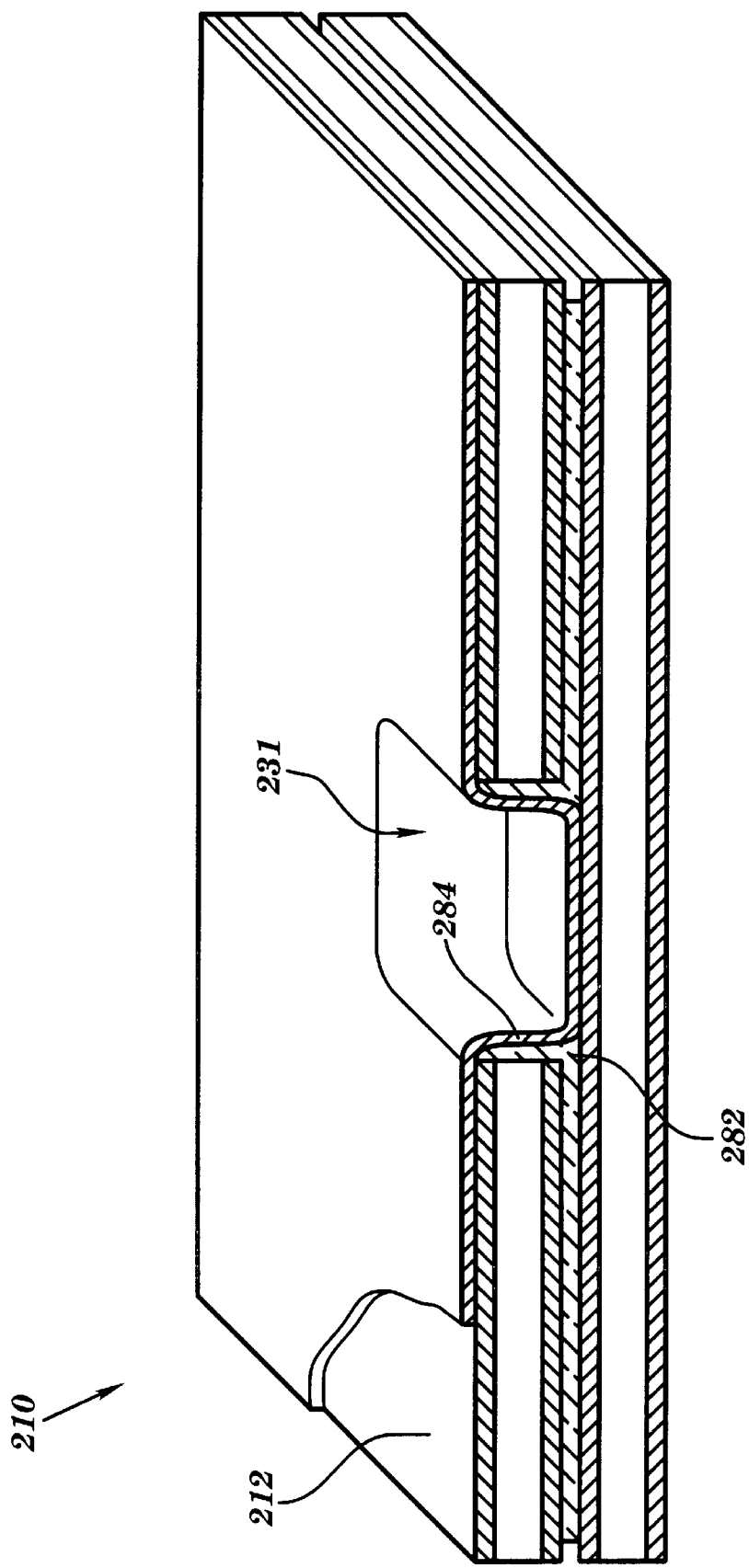
FIG. 11 illustrates a printed circuit board during the first stage of a first cavity circuitizing process according to the present invention.
Figure 12:
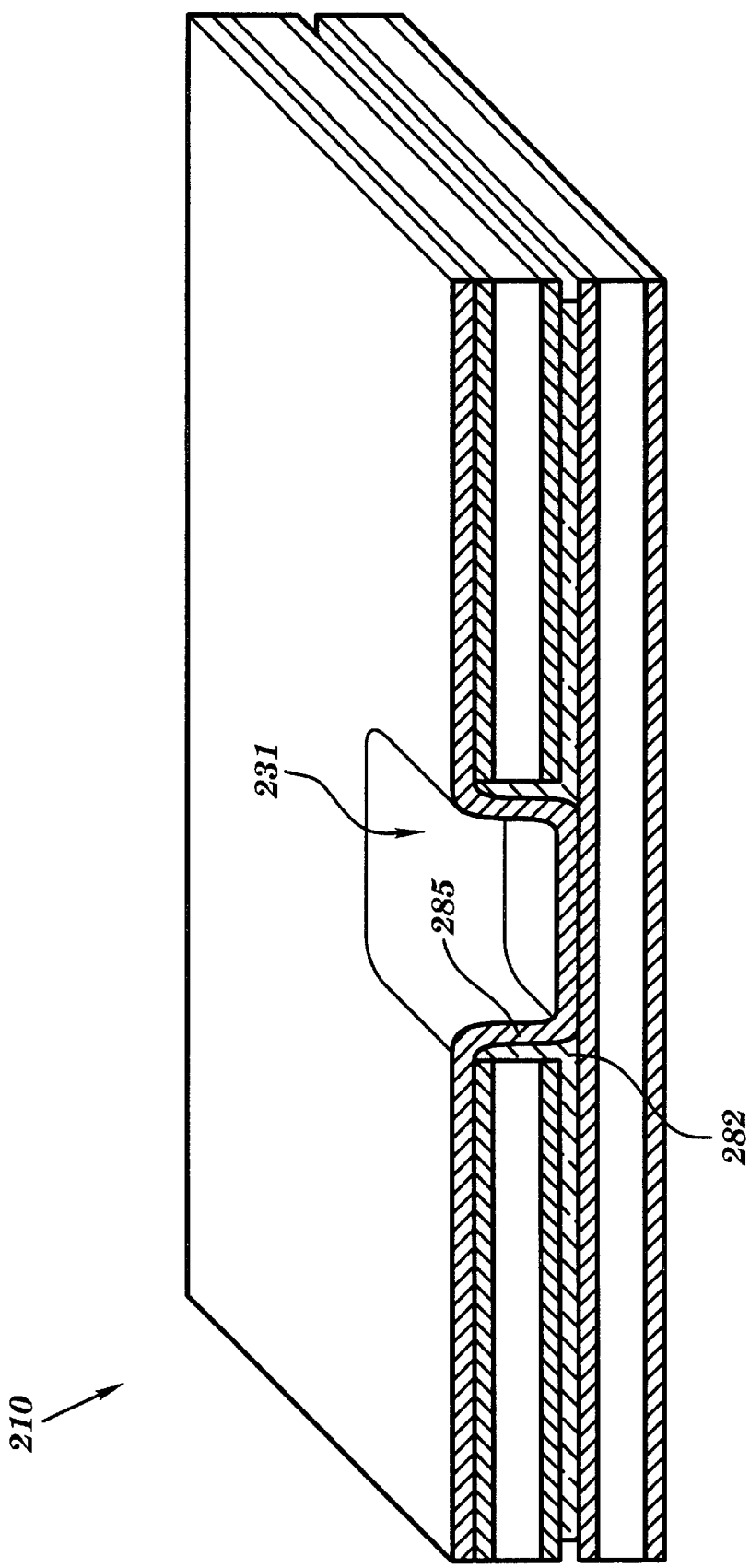
FIG. 12 illustrates the printed circuit board of FIG. 11 during a later stage in the first cavity circuitizing process.

In a first embodiment process, circuitized cavities in a PCB, and more specifically a laminate chip carrier, are created by subtractive processing. To begin this process, as shown in FIG. 11, a conductive material 284 (e.g., copper or gold), similarly to that shown in FIG. 6, is applied over the cavity 231 and, if desired, the surrounding surface 212 of the PCB 210. This plating may be provided by electroless or electrolytic plating. If electroless plating is preferred, a preliminary seeding of the cavity 231 and surrounding surface 212, e.g., plating with colloidal palladium/tin polymer suspension, will be provided. If electrolytic plating is preferred, a thin layer of electroless copper plating in the range of 0.5 $\mu$m to 2.5 $\mu$m is applied. As required, more conductive material is then electro or electrolessly plated over the PCB to a final desired thickness in the range of 25 $\mu$m to 50 $\mu$m as shown by the thicker layer 285 in FIG. 12.

Figure 13:
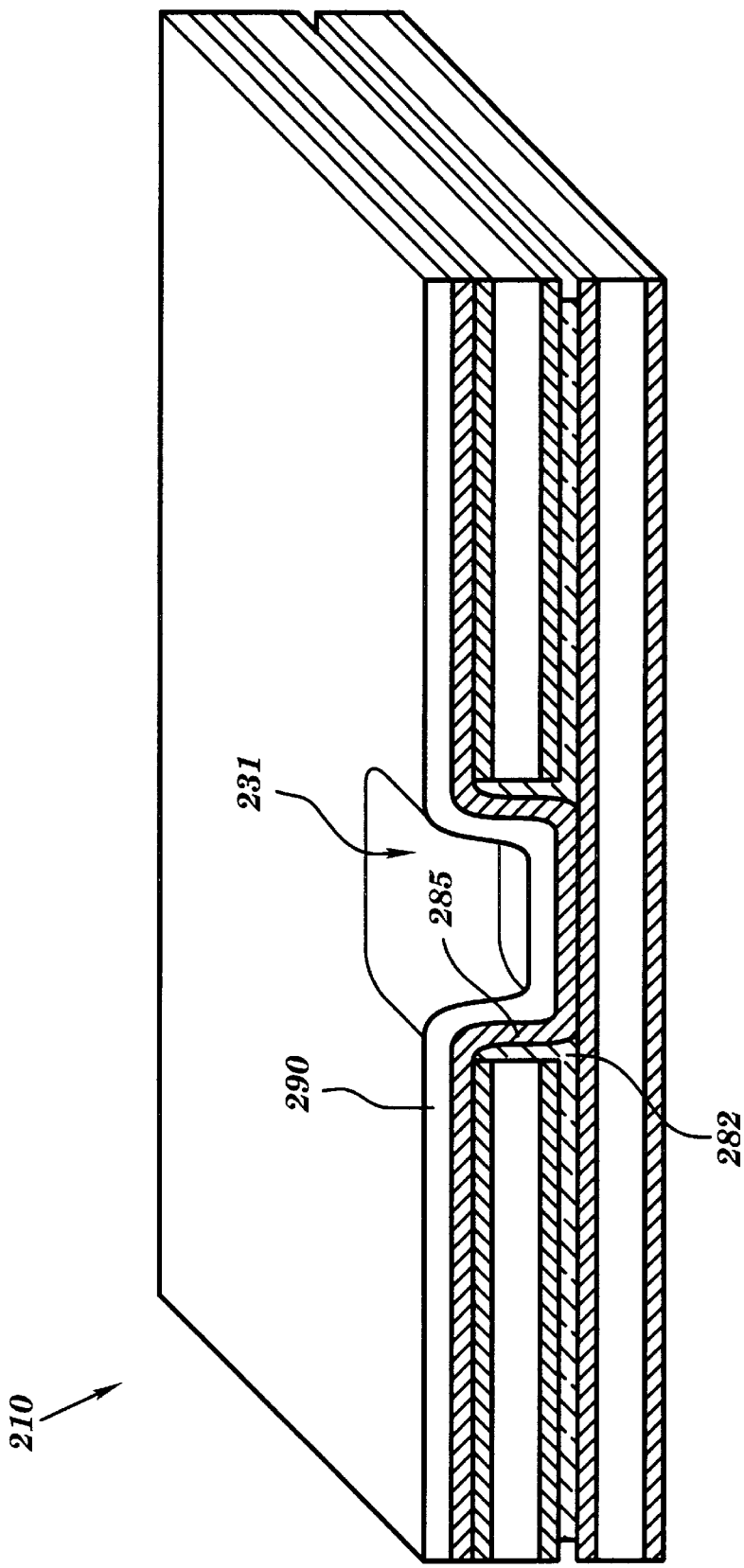
FIG. 13 illustrates the printed circuit board of FIG. 12 during a still later stage in the first cavity circuitizing process.

After the above plating, as shown in FIG. 13, a photo resist 290 is applied over the plated conductive material 285 wherever the latter was applied. All non-filleted cavities and most filleted cavities, depending on geometry, require use of a photo resist capable of conformal application to achieve intimate contact and acceptable adhesion on the external surface, the fillet or sidewall, and the cavity bottom surface. The two general categories of photo resist which are preferred for this are electro-deposited (ED) and liquid photo resists. It is important to note that other photo resists may be used if they provide acceptable conformation, contact and adhesion to the treated surface.

Imaging or exposure of the photo resist 290 is the next step.

Figure 14:
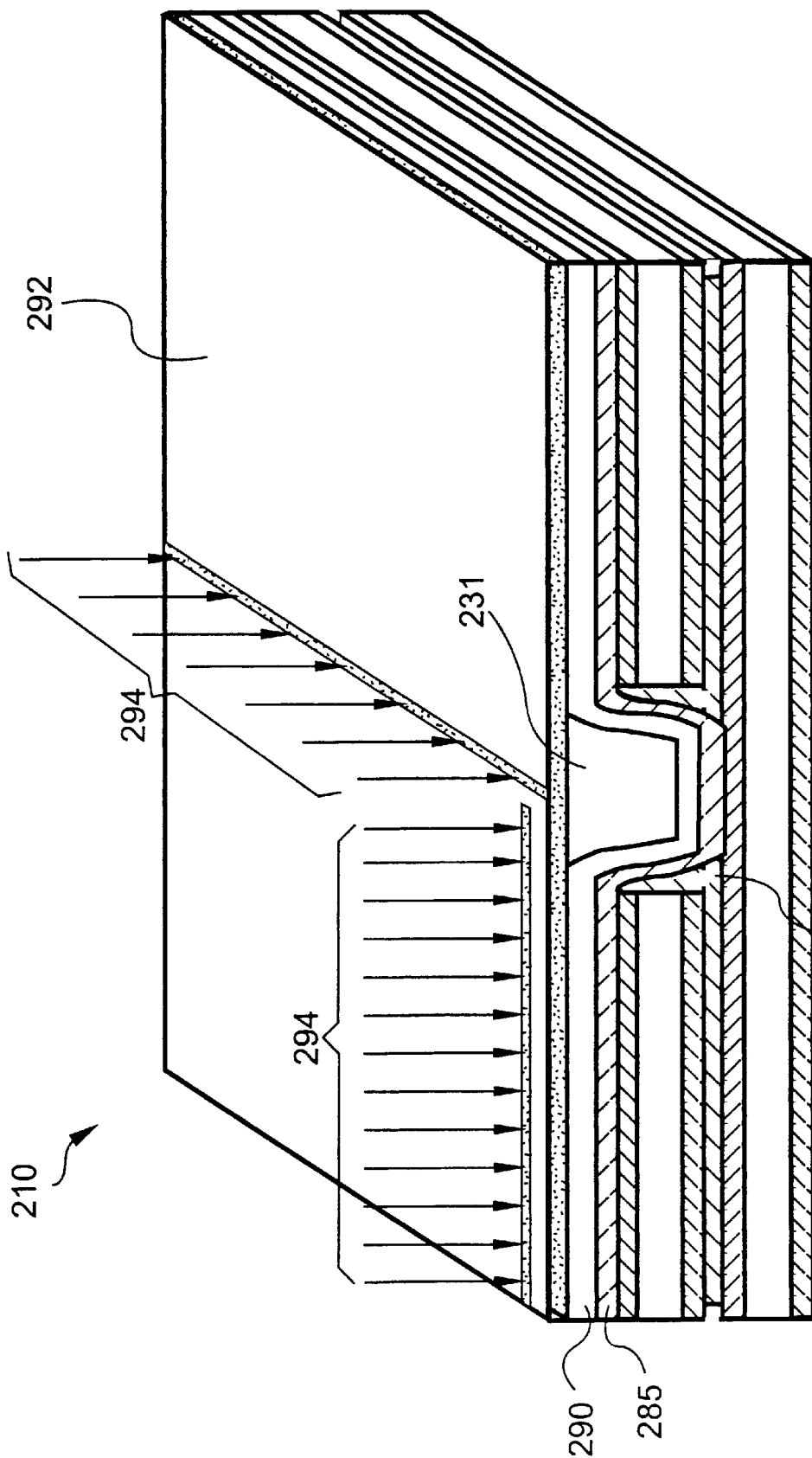
FIG. 14 illustrates the printed circuit board of FIG. 13 during a still later stage in the first cavity circuitizing process, i.e., exposure of a photo resist.

In the case of filleted cavities, a conventional R9 glass mask 292, as shown in FIG. 14, is placed over the photo resist 290 wherever it was applied and then it is exposed to a collimated light source 294, e.g., collimated ultraviolet light from a mercury lamp, and given the appropriate amount of UV energy. The collimated light source is defined generally as a light source having a declination angle of less than 1.5 degrees. As an alternative to an ultraviolet light source, the more collimated light 294 of laser direct imaging (LDI) may be used to expose the photo resist 290. When lasers are used, e.g., ultraviolet lasers, the positioning of the circuitry is provided by moving the laser to 'paint' the circuitry and the R9 glass mask 292 is not necessary.

In either alternative of light source, as a result of the light being collimated and, in the case of an ultraviolet light source, the R9 glass not significantly refracting the light, the depth of field is sufficient to expose both the outside surface, the fillet, including the sidewalls, and the cavity bottom. However, slight adjustments in "etch factor" may be needed in the artwork data to achieve the proper feature sizes of the final developed image for each of the location types due to image growth. In this regard, use of filleted sidewalls to permit uniform or very nearly uniform etch factors throughout the artwork is beneficial because it simplifies the artwork design and generation process.

Figure 15:
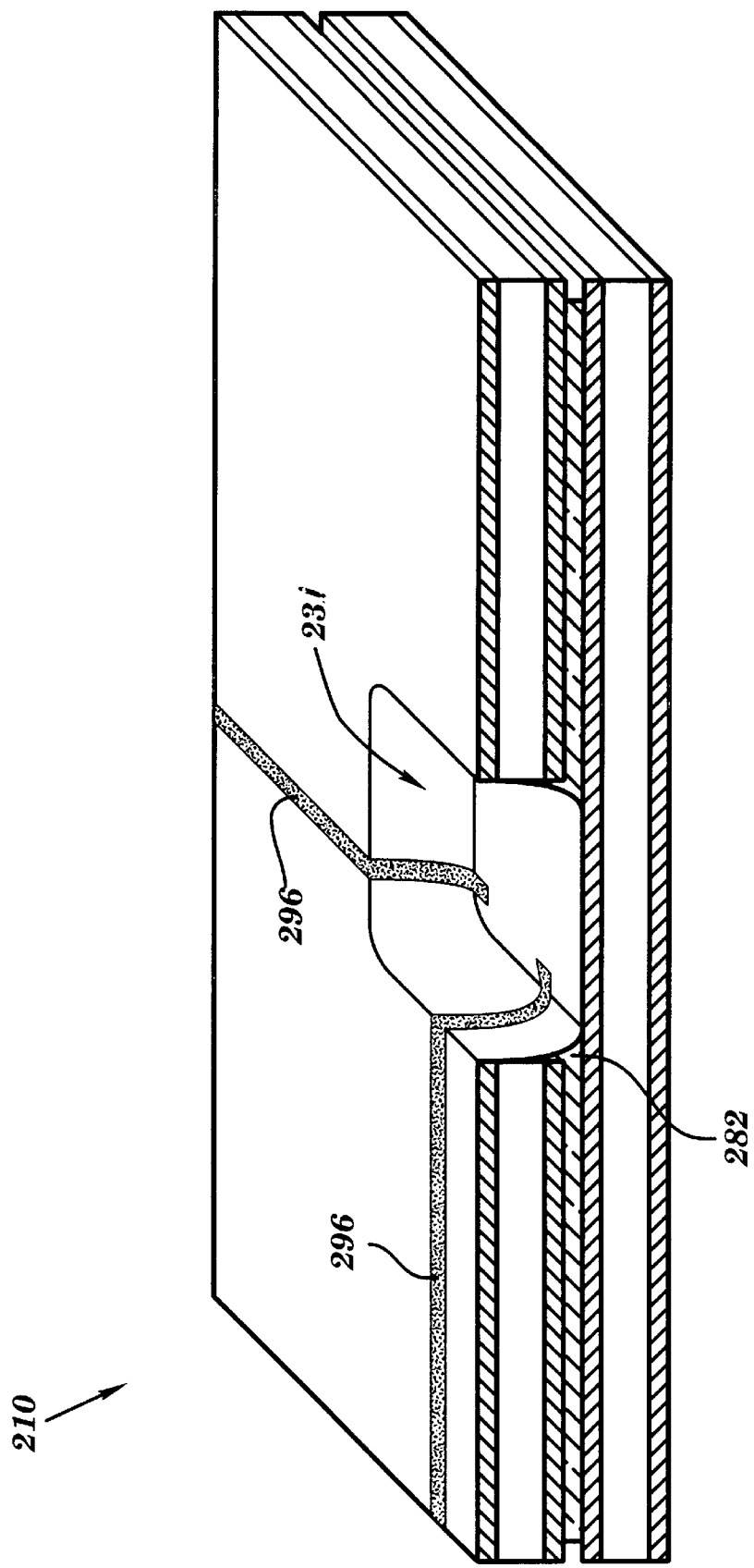
FIG. 15 illustrates the printed circuit board with a circuitized cavity created by the first and a second cavity circuitizing process according to the present invention.

Next, the conventional steps of developing the photo resist 290, etching the conductive material 285, and stripping the photo resist 290 are performed. Typically sodium carbonate is used to develop away unwanted aqueous photo resist. Cupric chloride is then used to etch away unwanted conductive material. Sodium hydroxide is then used to remove the remaining photo resist. As will be understood by one having ordinary skill in the art, other materials may also be used to accommodate the above steps. The resultant circuit features or lines 296 on the cavity and, if provided, surface of the PCB are shown in FIG. 15. If the cavity and surface are circuitized simultaneously by the above method, the circuit features or lines so created are contiguous from the cavity to the surface.

Figure 16:
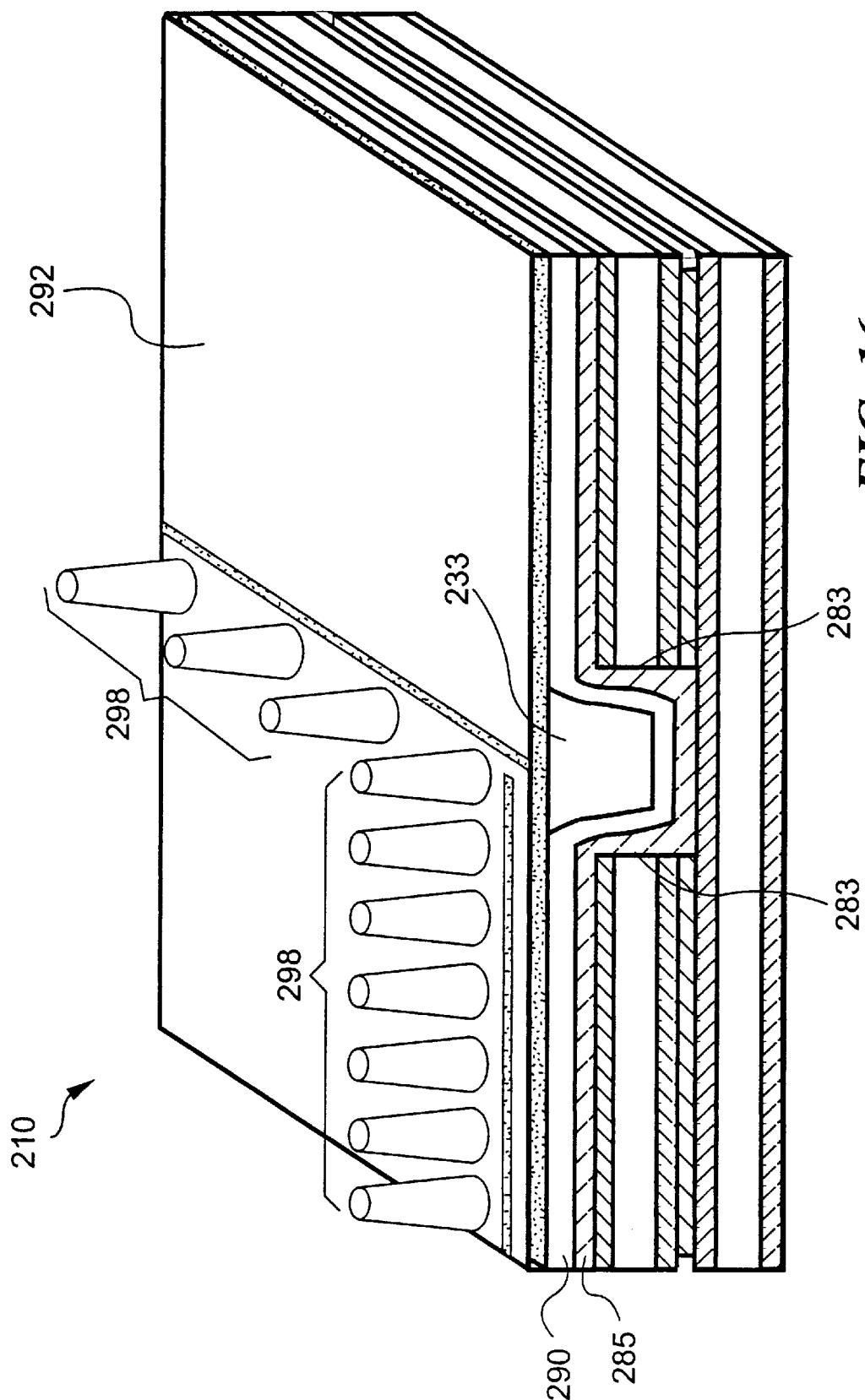
FIG. 16 illustrates the printed circuit board of FIG. 14 during an alternative exposure process.

With regard to non-filleted sidewalls 283, as shown in FIG. 16, only ED and liquid photo resists can be used to successfully circuitize the cavity 233. However, in this case a non-collimated UV light source 298, e.g., light from a mercury lamp, should be used because highly collimated light will only illuminate a surface with some degree of slope normal to the light source. Accordingly, circuitization of the sidewall would not be accomplished using such a collimated light source. The slightly divergent light of a non-collimated source, however, will illuminate the sidewall and expose the resist as required. The PCB is then processed through conventional develop etch and strip processes.

Figure 17:
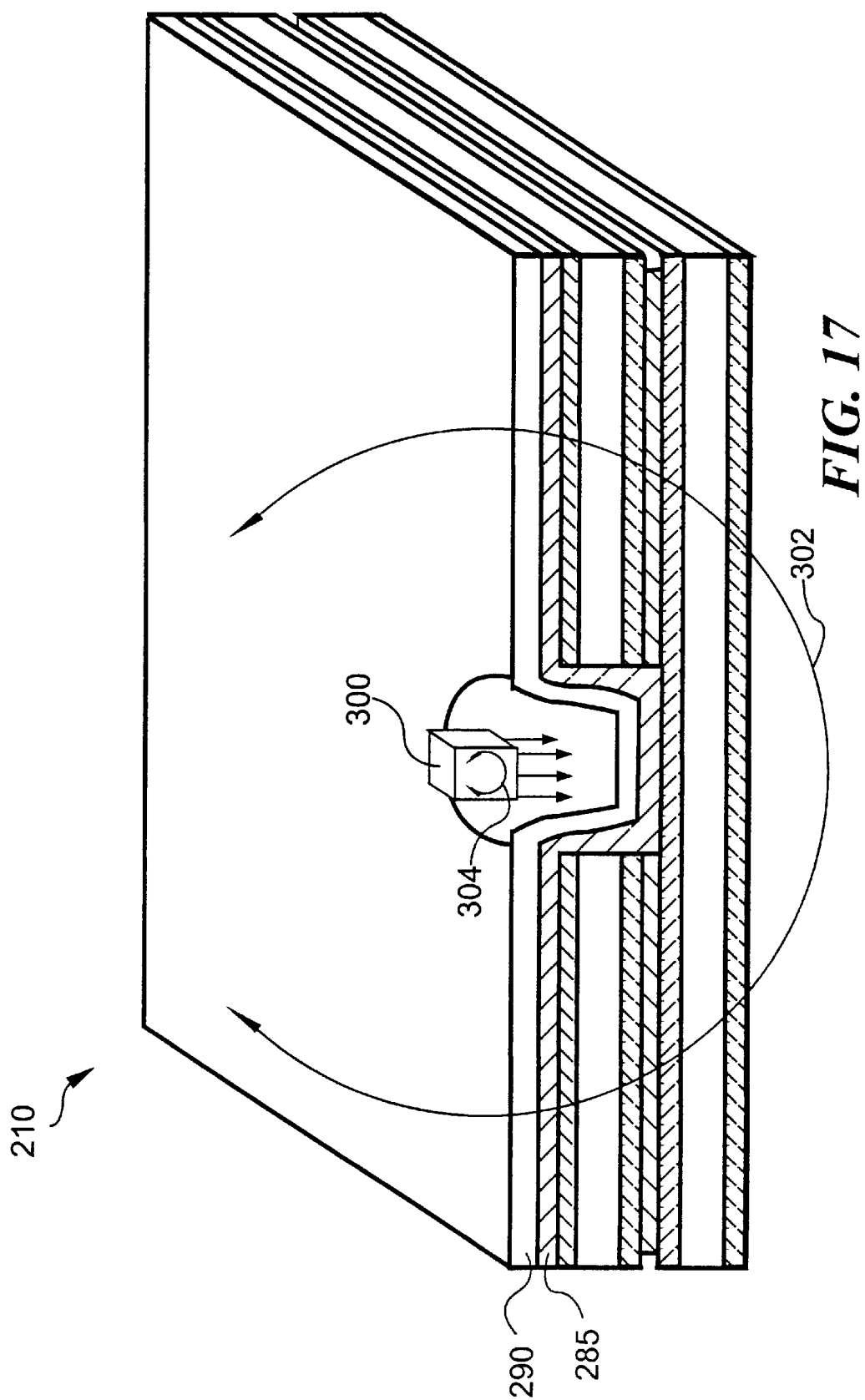
FIG. 17 illustrates the printed circuit board of FIG. 14 during another alternative exposure process.

Very deep cavities pose a number of specializations in the process. For instance, only ED or liquid resists can be used with very deep cavities. Additionally, as shown in FIG. 17, it is beneficial to use laser direct imaging (LDI) in this setting since LDI offers the advantage of very long depth of field, or focal length. The laser 300 may be provided with the ability to tilt as indicated by arrow 304. To take advantage of this feature, it is necessary to image a portion of the PCB 210 and then rotate the PCB 90 degrees, as indicated by arrow 302, and expose the remaining sidewalls which are reoriented 90 degrees to the first. Laser or PCB holding systems without the ability to 'tilt' are not capable of exposing non-filleted cavity sidewalls.

In a second alternative process embodiment, the circuitized cavity is created by pattern plating processing, also known as additive processing, illustrated in FIGS. 18–21.

Figure 18:
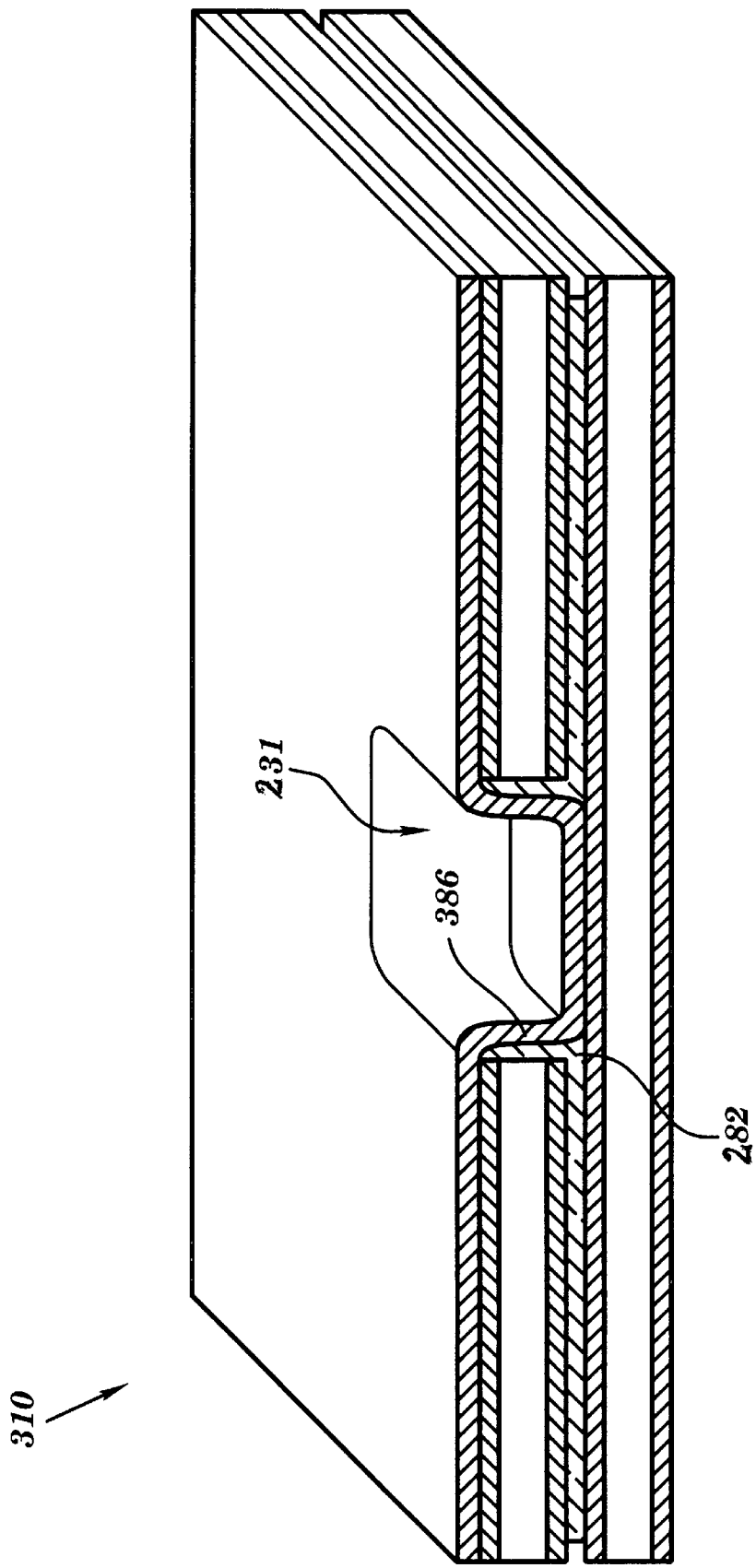
FIG. 18 illustrates a printed circuit board during the first stage of a second cavity circuitizing process according to the present invention.

In this embodiment, as shown in FIG. 18, the cavity 210 and, if desired, the surface of the PCB 210 (e.g., laminate chip carrier) is first seeded with a seeding material 386, e.g., colloidal pallatium/tin polymer suspension to enable electroless plating. (As discussed later, if circuit features are desired to be connected to buried conductors in the PCB, pathways through the fillet must be made using ablative laser machining prior to the above step of seeding.)

Figure 19:
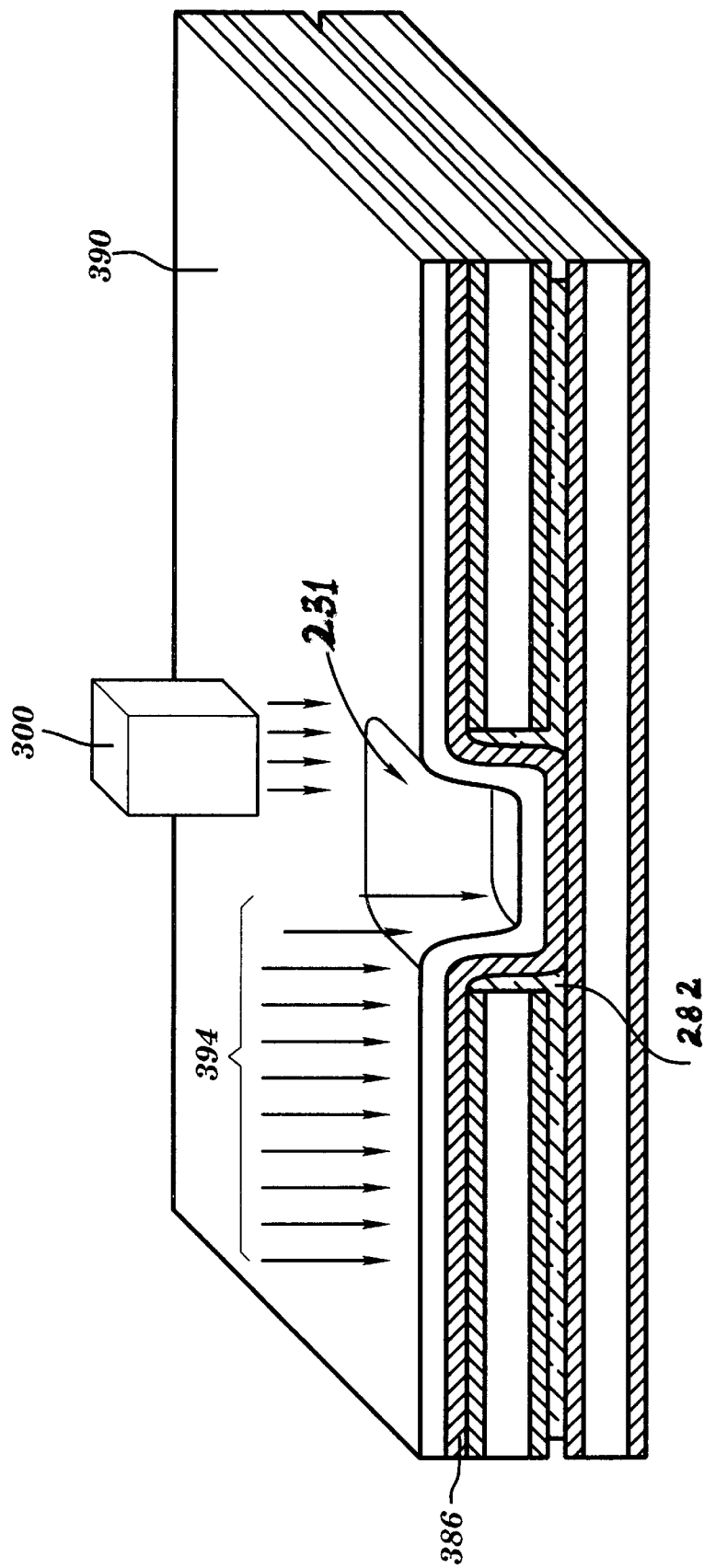
FIG. 19 illustrates the printed circuit board of FIG. 18 during a later stage in the second cavity circuitizing process.

Next, as shown in FIG. 19, a photo resist 390 is applied over the cavity 231 and, if desired, the surrounding surface. As with the previously described method, use of a photo resist capable of conformal application to achieve intimate contact and acceptable adhesion on the external surface, the fillet or sidewall, and the cavity bottom surface is required. The two general categories of photo resist which are preferred for this are electro-deposited (ED) and liquid photo resist. However, other photo resists may be utilized in some instances. For example, in some cases of filleted cavities having low aspect ratios and depths of approximately 0.15 mm or less, conventional dry film photo resists can be applied using vacuum assisted lamination (not shown).

Figure 20:
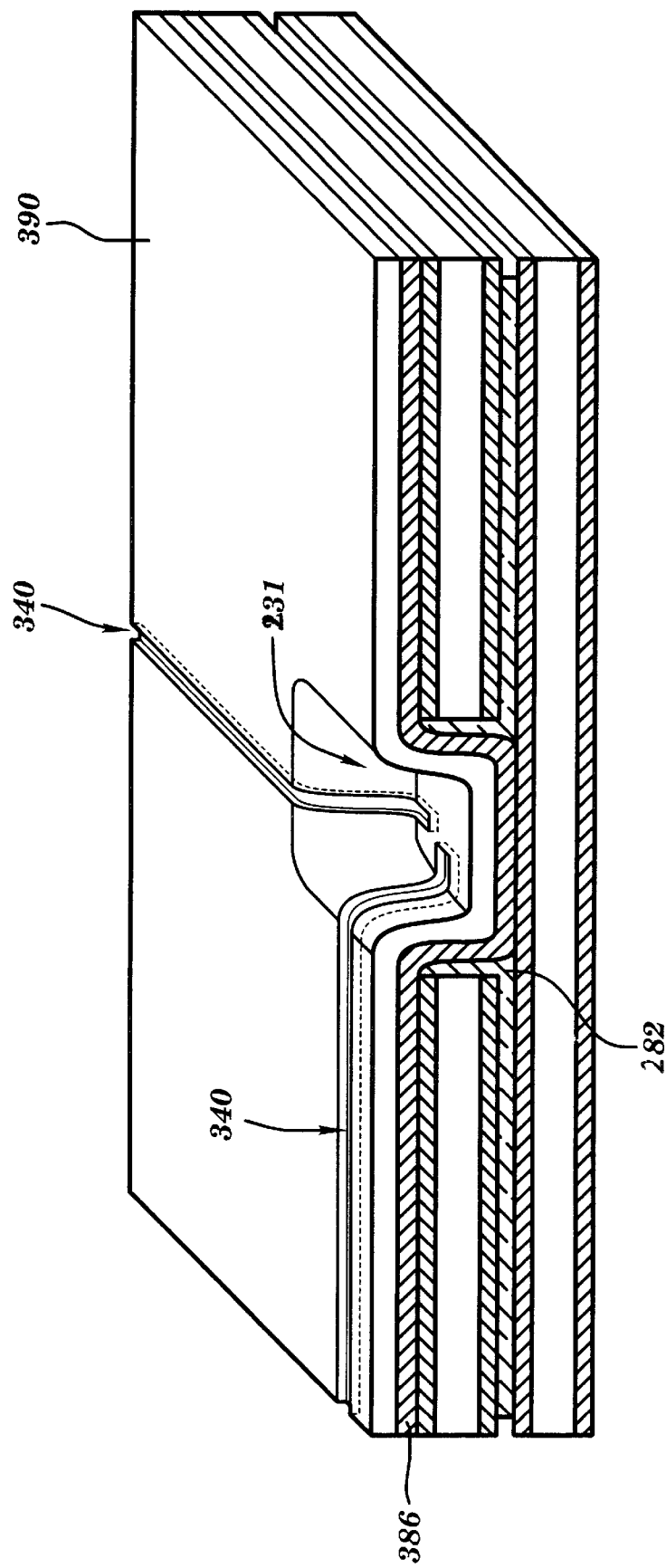
FIG. 20 illustrates the printed circuit board of FIG. 18 during a still later stage in the second cavity circuitizing process.

As also shown in FIG. 19, the next step is to expose the photo resist 390, to a collimated ultraviolet light source 394, e.g., collimated light from a mercury lamp, or an laser 300 to define the location of channels in the photo resist 390 where the photo resist is not exposed. These channels will later become circuit features. As noted above, if the ultraviolet light source is used, an R9 glass mask (not shown) is required to be preliminarily laid to provide a template for the exposure. Next, as shown in FIG. 20, the photo resist is developed to form channels 340 in the photo resist wherever the photo resist was exposed.

Figure 21:
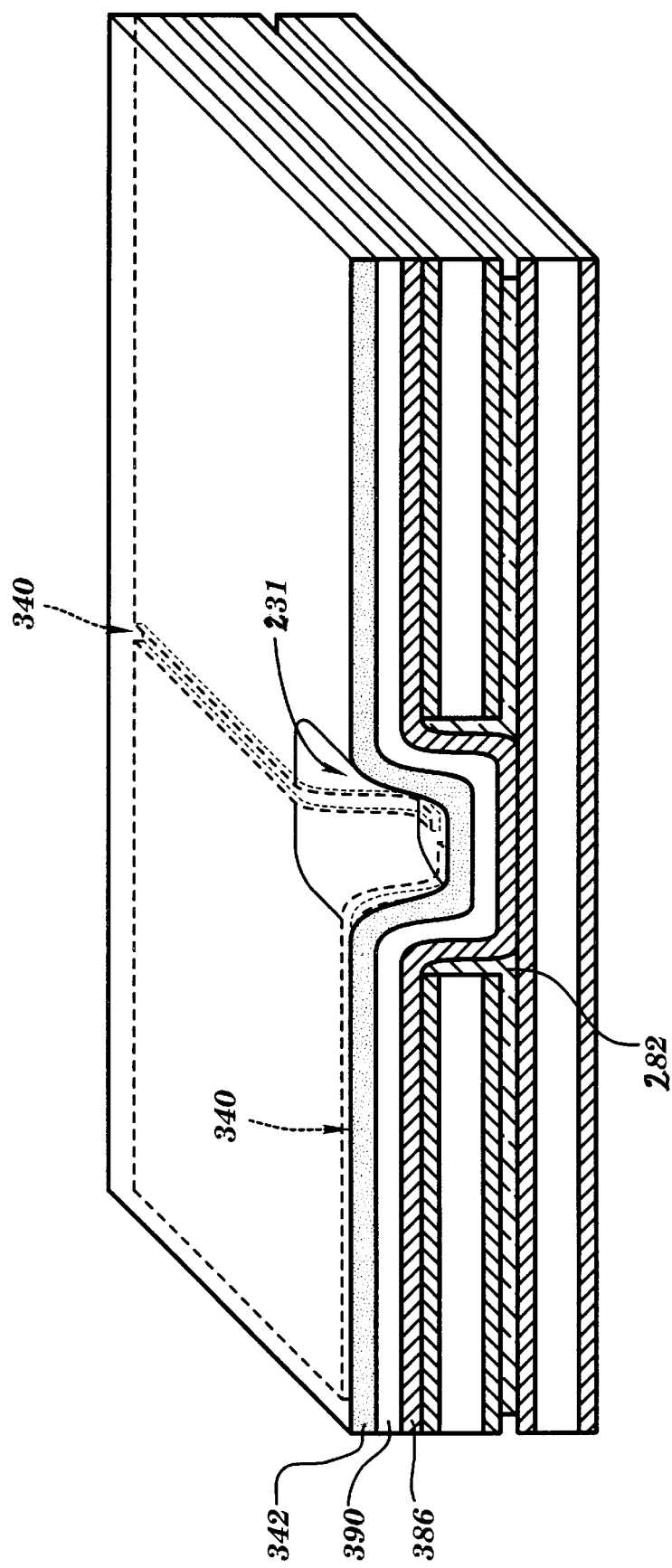
FIG. 21 illustrates the printed circuit board of FIG. 18 during a still later stage in the second cavity circuitizing process.

Then to form the circuit features, as shown in FIG. 21, the cavity 231 and, if desired, the surrounding surface are plated with a conductive material 342, e.g., copper or gold, to fill in the channels 340. Next, photo resist 390 is removed leaving a contiguous circuit across the cavity sidewalls and, if provided, the surface of the printed circuit board. If the process was applied to both the cavity and surface, contiguous circuit features or lines are created. The resulting PCB with circuitized cavity is the same as that shown in FIG. 15. If desired, at this point, the seeding material may also be removed.

The use of circuitized cavities offers product designers a number of potentially advantageous opportunities. The most obvious, shown in FIGS. 22–25, is to utilize circuit features or lines 296, which extend along the cavity sidewall and bottom, as a 'replacement' for wire bond connections. Wire bond connections normally jump the gap between the top surface 212 of the PCB to the top 322 of electronic component (e.g., a chip) 320 and are encapsulated to hold them in place. The encapsulant traditionally covers the entire electronic component 320, including the top 322 and, as a result, convection cooling is limited. Furthermore, since wire bonds are on top of the electronic component, they are subject to damage.

Figure 22:
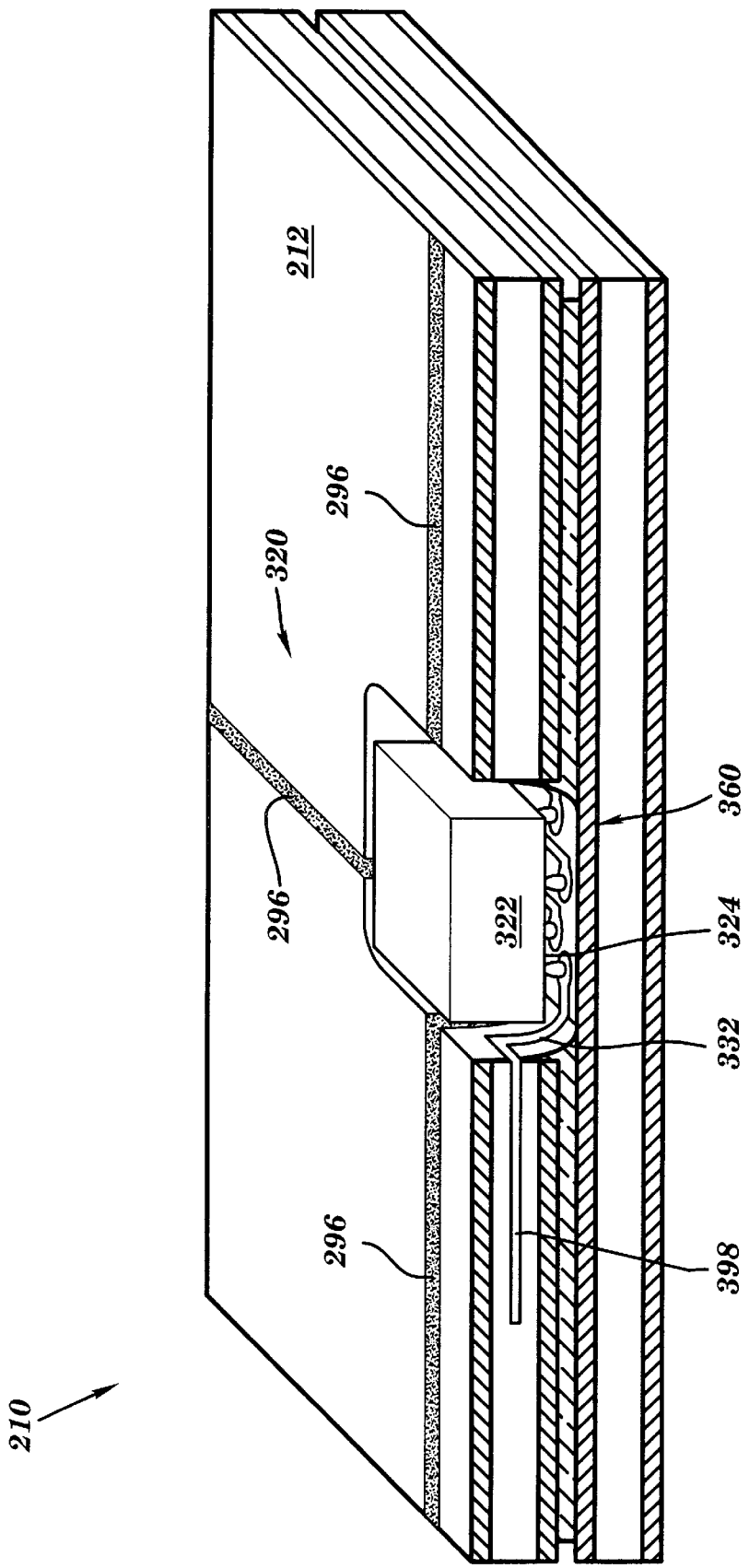
FIG. 22 illustrates a printed circuit board with an electronic component mounted within and using the circuitized cavity according to the present invention.
Figure 23:
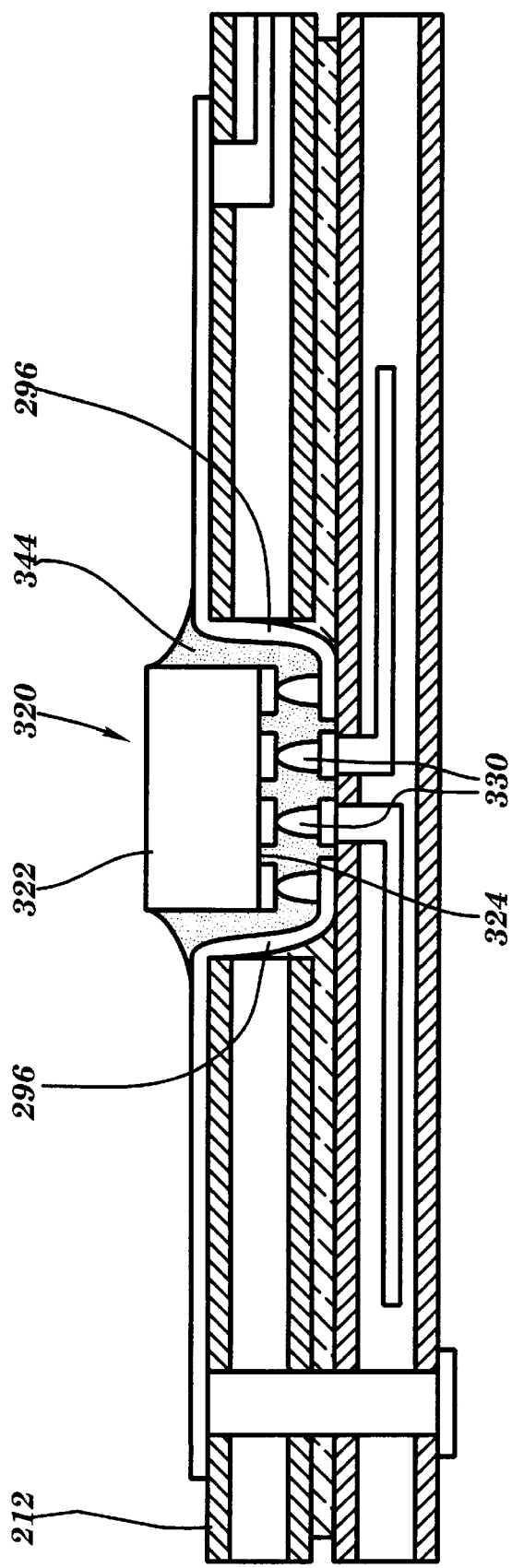
FIG. 23 illustrates an alternative printed circuit board with an electronic component mounted within and using the circuitized cavity according to the present invention.

According to the present invention, as shown in FIGS. 22–23, however, an electronic component 322 is flipped over. A ball grid array (BGA) type connection 360 is provided from the bottom 324 of the electronic component 322 to the ends of the circuit lines 296 underneath the electronic component 322. In addition, circuit lines 296 in the cavity are contiguous with the internal circuit structure 398 in the laminated PCB 210. FIG. 22 shows that the circuit lines 296 are connected to the internal circuit structure 398 through a metal line 332 on running from the bottom to the side of the cavity.

Figure 24:
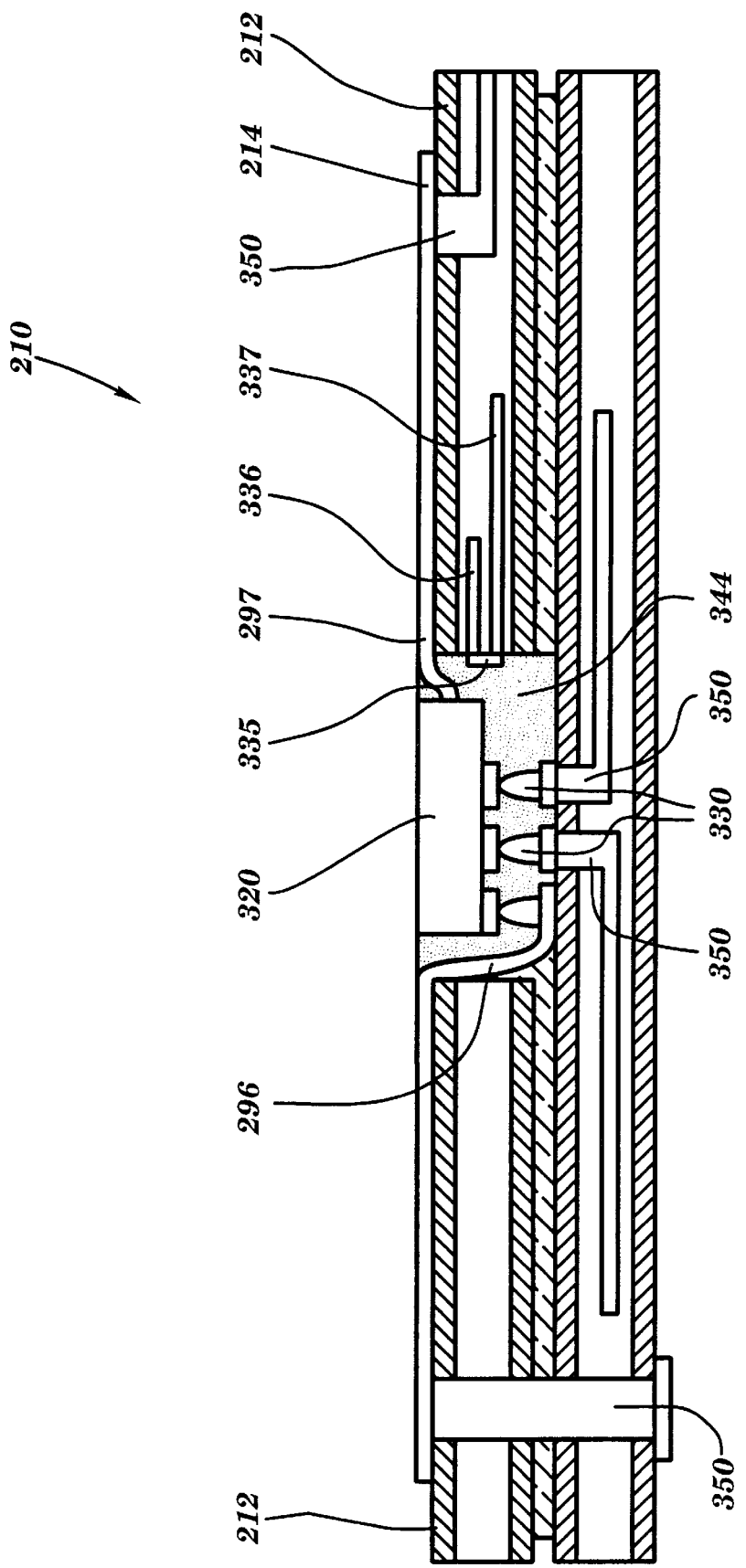
FIG. 24 illustrates another alternative printed circuit board with an electronic component mounted within and using the circuitized cavity in accordance with the present invention.

The circuit features 296 are shown to extend along the bottom of the cavity to the solder ball connections (SBCs) 330 (see FIGS. 23–25) of the ball grid array 360. However, the circuit features do not necessarily have to run onto the bottom of the cavity if connection to the electronic component 320 is possible at the top. Additionally, as shown in FIG. 24, circuit features 336, 337 within the interior of the PCB 210 may enter the cavity sidewalls and connect to circuit features 335, thus reducing the need for a plated through hole 350 that travels up or down to another layer of the PCB. These internal circuit features 335 can then travel down to the electronic component, up or down to another layer where they re-enter the PCB interior or around the periphery of the cavity sidewall.

This type of "all layer functionality" is most feasible with non-filleted sidewalls since no additional process steps are necessary to bring internal circuits out to the cavity edge. With filleted cavities, as noted earlier, additional steps such as laser ablation of specific points in the filleted cavity sidewalls is necessary prior to any seeding step so that locations for the circuit features on the sidewalls can be provided. For instance, the additional step may entail using an excimer or carbon dioxide ($CO_2$) laser to remove fillet material down to the buried circuit feature. As mentioned earlier, this is done prior to the seeding material is applied.

As a result of the above design, reliable connections are easier to obtain since the wire connections 296 are protected by the electronic component 320. Furthermore, as shown in FIG. 24, the above design offers additional input/output (I/O) density since the flipped electronic component 320 can use power and signal circuit features 297, i.e., wire bonds, which come to the top 322 of the electronic component 320 and power and signal circuit features 296 which come to the bottom of the electronic component 320 from the bottom surface of the cavity. Furthermore, connections can be made to the bottom of the electronic component 320 from plated through holes 350 in the bottom of the cavity. Accordingly, another advantage is the possibility to either reduce the crowding of the wire bonds or double the number of connections to any one electronic component 320.

Another advantage, as shown in FIG. 22, is realized in that the circuit features 296 are self supporting and do not require encapsulation. As a result, the connections are more reliable and easier to rework than conventional wire bond connections. Furthermore, this arrangement allows BGA connections, while keeping the majority of the area under the electronic component intact (free from drilled holes) and available for heat conduction away from chip.

Figure 25:
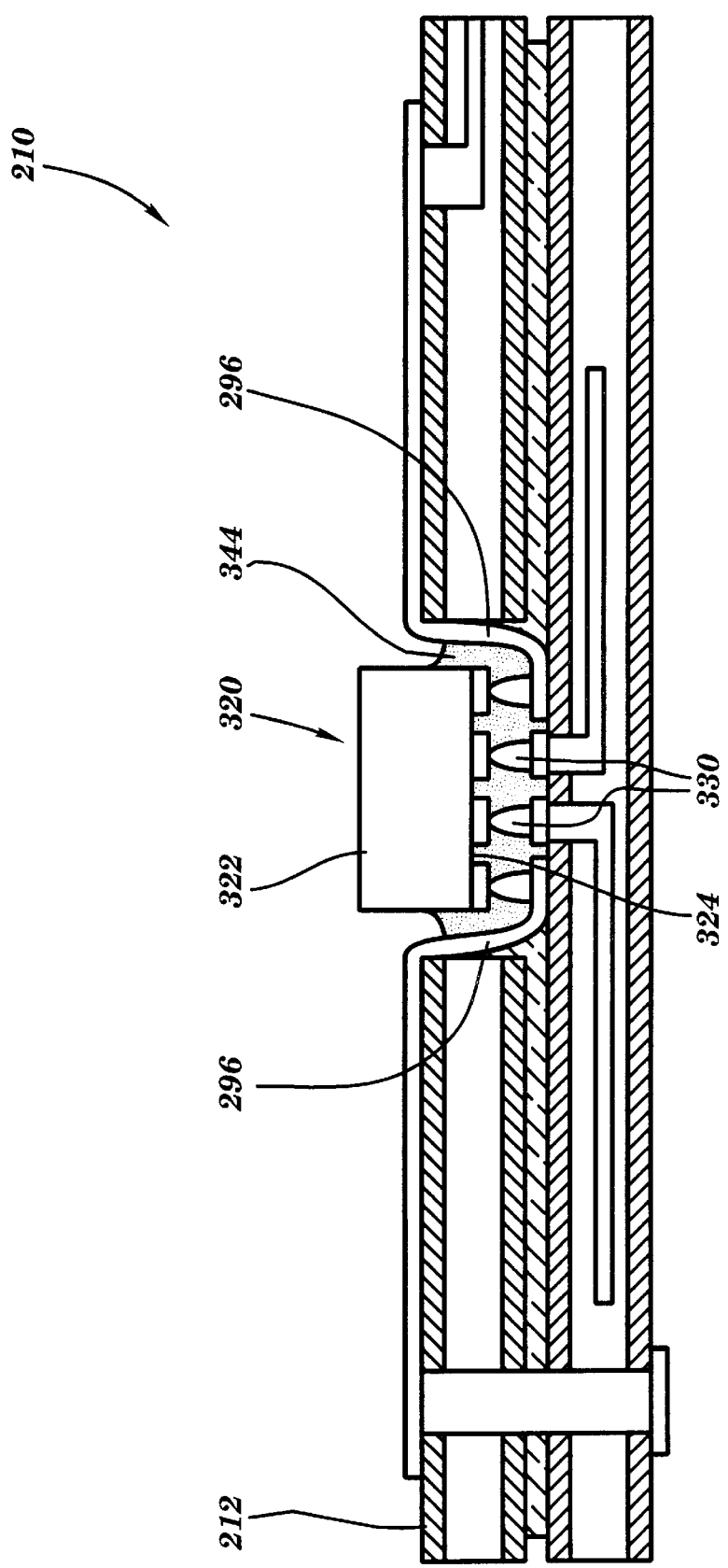
FIG. 25 illustrates another alternative printed circuit board with an electronic component mounted within and using the circuitized cavity in accordance with the present invention.

Another advantage of the present invention lies in the fact that even though the electronic component 320 does not require encapsulant, the electronic component 320 may be at least partially underfilled with encapsulant 344 as shown in FIGS. 23–25. The underfilling 344 is beneficial in that the encapsulant reduces mechanical stresses where the electronic component and PCB or other related structure have different coefficients of thermal expansion, i.e. the encapsulant aids to hold the electronic component more securely during temperature changes.

Furthermore, as illustrated by comparing FIGS. 22 and 24, with or without encapsulant 344, completely flush packages can be designed. If the cavity is made as deep as the electronic component is thick, circuits from the top layer can be run down the cavity sidewall and terminate in a solder ball or column. The entire cavity can then be filled with encapsulant 344 flush with the top surface 214 of the now circuitized PCB as shown in FIG. 24. Therefore, SBC attached packages and more complex PCBs are possible without additional thickness.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method for circuitizing a cavity in a laminated printed circuit board having an internal circuit structure, the method comprising the steps of:
   forming the cavity having a fillet of dielectric material that covers sides of the cavity;
   applying a conductive material conformally to at least the cavity;
   ablating part of the fillet to reveal an underlying part of the internal circuit structure;
   applying a photo resist conformally over the conductive material;
   patterning the photo resist to delineate a circuit feature in the cavity; and
   etching the conductive material to create the circuit feature in the cavity, a portion of the circuit feature being connected to the part of the internal circuit structure in the laminated printed circuit board.

2. The method of claim 1, wherein the step of patterning the photo resist includes exposing the photo resist to a collimated light source.

3. The method of claim 2, wherein the collimated light source is selected from the group consisting of a mercury lamp and a laser.

4. The method of claim 3, wherein the step of patterning the photo resist further includes applying a glass mask overlying the photo resist.

5. The method of claim 2, wherein the step of patterning the photo resist includes using laser direct imaging to form a circuit feature pattern on the photo resist.

6. The method of claim 2, wherein the step of patterning the photo resist further includes developing the photo resist after exposing the photo resist.

7. The method of claim 1, wherein the cavity includes a bottom and sidewalls that are substantially square to the bottom.

8. The method of claim 7, wherein the step of patterning the photo resist includes exposing the photo resist to a non-collimated light source through a glass mask.

9. The method of claim 1, wherein the step of patterning the photo resist further includes the steps of:
   exposing the photo resist to a laser direct imaging source in a first orientation with respect to the laminated printed circuit board;
   tilting at least one of the laser direct imaging source and laminated printed circuit board 90 degrees to achieve a second orientation of the laser direct imaging source with respect to the laminated printed circuit board; and
   exposing the photo resist to the laser direct imaging source in the second orientation with respect to the laminated printed circuit board.

10. The method of claim 1, wherein the step of applying a conductive material conformally to at least the cavity includes disposing a layer of the conductive material conformally on the laminated printed circuit board using a plating process selected from the group consisting of electroless plating and electrolytic plating.

11. The method of claim 10, wherein the step of applying a conductive material further includes applying a seeding material to enable electroless plating of the conductive material.

12. The method of claim 11, wherein the seeding material is a colloidal palladium/tin polymer suspension.

13. The method of claim 1, wherein the step of applying a photo resist conformally over the conductive material includes applying the photo resist conformally to the cavity and a surface of the laminated printed circuit board surrounding the cavity.

14. The method of claim 1, wherein the step of applying a photo resist includes applying electro-deposited photo resist.

15. The method of claim 1, wherein the step of applying a photo resist applying liquid photo resist.

16. The method of claim 1, further comprising the step of connecting an electronic component to the circuit feature in the cavity.

17. The method of claim 16, wherein the electronic component is at least partially encapsulated within the cavity.

18. The method of claim 16, wherein the step of connecting the electronic component includes solder bonding a ball grid array of the electronic component to a portion of the circuit feature at a bottom of the cavity.

19. The method of claim 16, wherein the step of connecting the electronic component further includes connecting the electronic component to the portion of the circuit feature contiguous to the internal circuit structure in the laminated printed circuit board.

20. The method of claim 19, wherein the portion of the circuit feature contiguous to the internal circuit structure in the laminated printed circuit board is on a sidewall of the cavity.

21. The method of claim 1 wherein the step of forming the cavity having a fillet of dielectric material that covers sides of the cavity comprises the following steps:
   sandwiching a sticker sheet between first and second metallized dielectric layers, the second metallized dielectric layers and the sticker sheet each having a window that is registered with the other window, thereby creating the cavity;
   laying a flexible release layer above the second metallized dielectric layers;
   laying a sheet of material on the release layer over the cavity, the material being soft and conformable at room temperature to seal a bottom periphery of the cavity yet viscous to effectively dam the periphery; and
   subjecting the first and second metallized dielectric layers, sticker sheet, release layer and material to heat and pressure, the pressure forcing the material into the cavity to seal the bottom periphery of the cavity before the heat and pressure cause the sticker sheet to flow beyond the seal, the heat and pressure causing the sticker sheet to flow and conform to the seal, curing the sticker sheet to bind the first and second metallized dielectric layers to each other, and creating the fillet of dielectric around sides of the cavity.

22. A method of metallizing a cavity in a printed circuit board, comprising the steps of:
   providing the printed circuit board having the cavity formed therein, the printed circuit board also having an internal circuit structure between a front surface and a back surface of the printed circuit board, wherein the cavity is formed through the following steps:
      sandwiching a sticker sheet between first and second metallized dielectric layers, the second metallized dielectric layers and the sticker sheet each having a window that is registered with the other window, thereby creating the cavity;
      laying a flexible release layer above the second metallized dielectric layers;
      laying a sheet of material on the release layer over the cavity, the material being soft and conformable at room temperature to seal a bottom periphery of the cavity yet viscous to effectively dam the periphery; and
      subjecting the first and second metallized dielectric layers, sticker sheet, release layer and material to heat and pressure, the pressure forcing the material into the cavity to seal the bottom periphery of the cavity before the heat and pressure cause the sticker sheet to flow beyond the seal, the heat and pressure causing the sticker sheet to flow and conform to the seal, curing the sticker sheet to bind the first and second metallized dielectric layers to each other, and creating a fillet of dielectric around sides of the cavity;
   disposing a conductive layer conformally to the cavity;
   disposing a photo resist conformally on the conductive layer;
   exposing the photo resist to delineate a circuit feature pattern in the cavity;
   developing the photo resist; and
   etching the conductive layer through the photo resist to create a circuit feature from the circuit feature pattern in the cavity.

23. The method of claim 22, wherein the step of disposing a photo resist includes forming a electro deposited photo resist layer conformally on the conductive layer.

24. The method of claim 22, wherein the step of exposing the photo resist includes exposing the photo resist to a collimated light source.

25. The method of claim 22, wherein the collimated light source is selected from the group consisting of an ultraviolet light source and a laser.

26. The method of claim 25, wherein the step of exposing the photo resist further includes exposing the photo resist through a glass mask.

27. The method of claim 22, wherein the step of exposing the photo resist further includes the steps of:
   exposing the photo resist to a laser direct imaging source in a first orientation relative to the printed circuit board;
   tilting at least one of the laser direct imaging source and printed circuit board to reach a second orientation of the laser direct imaging source relative to the printed circuit board; and
   exposing the photo resist to the laser direct imaging source in the second orientation relative to the to printed circuit board.

28. The method of claim 22, wherein the step of disposing a photo resist includes forming a liquid photo resist conformally on the conductive layer.

29. The method of claim 22, wherein the step of etching the conductive layer further includes forming the circuit feature running along a sidewall and a bottom of the cavity.

30. The method of claim 22, wherein the step of disposing a conductive layer includes plating the printed circuit board with the conductive layer in a process selected from the group consisting of electroless plating and electrolytic plating.

31. The method of claim 30, wherein the step of disposing a conductive layer further includes applying a seeding material to enable electroless plating of the conductive layer.

32. The method of claim 31, wherein the seeding material is a colloidal palladium/tin polymer suspension.

33. The method of claim 22, further comprising the step of connecting an electronic component, located at least partially within the cavity, to the circuit feature in the cavity.

34. The method of claim 33, wherein the electronic component is at least partially encapsulated within the cavity.

35. The method of claim 33, wherein the step of connecting the electronic component includes providing wire bonding from the surface to the electronic component.

36. The method of claim 35, wherein the electronic component is mounted in the cavity such that a top surface of the electronic component is flush with the front surface of the printed circuit board.

37. The method of claim 22, wherein the step of disposing a conductive layer further includes disposing the conductive layer over the front surface of the printed circuit board.

38. The method of claim 22 further comprising the steps of:

ablating part of the fillet to reveal an underlying part of the internal circuit structure; and connecting the circuit feature to the part of the internal circuit structure in the laminated printed circuit board.

* * * * *